United States Patent [19]
Masuda

[11] Patent Number: 6,087,850
[45] Date of Patent: Jul. 11, 2000

[54] OPERATION CIRCUIT

[75] Inventor: Shinichi Masuda, Tokyo, Japan

[73] Assignees: Mitsubishi Denki Kabushiki Kaisha; Mitsubishi Electric Engineering Co., Ltd., both of Tokyo, Japan

[21] Appl. No.: 09/026,396

[22] Filed: Feb. 19, 1998

[30] Foreign Application Priority Data

Aug. 27, 1997 [JP] Japan .................................. 9-230949

[51] Int. Cl.[7] .................................................. G06F 7/50
[52] U.S. Cl. ........................... 326/55; 326/113; 326/106; 326/108
[58] Field of Search .................................. 326/53, 54, 55, 326/106, 108, 112, 119, 121; 708/700–714

[56] References Cited

U.S. PATENT DOCUMENTS 4,907,184  3/1990  Nakano et al. ........................ 364/736

OTHER PUBLICATIONS

Ishihara et al., "A Half–pel Precision MPEG2 Motion–Estimation Processor with Concurrent Three–Vector Search," IEEE Journal of Solid–State Circuits, vol. 30, No. 12, Dec. 1995, pp. 1502–1509.

*Primary Examiner*—Michael Tokar
*Assistant Examiner*—Anh Tran
*Attorney, Agent, or Firm*—Burns, Doane, Swecker & Mathis, LLP

[57]  ABSTRACT

The first store unit (R1) for receiving and storing the first input (AI), the second store unit (R2) for receiving and storing the second input (BI), a selection unit (SEL) for selecting one of outputs from the first inverter (IV1) and the second inverter (IV2) in the second store unit (R2) in response to an output of the first store unit (R1) are provided in an operation circuit. This constitution, which has a function of storing the first input (AI) and the second input (BI) and a function of performing an exclusive-OR operation between the first input (AI) and the second input (BI), allows reduction in circuit scale.

8 Claims, 17 Drawing Sheets

FIG. 15
BACKGROUND ART
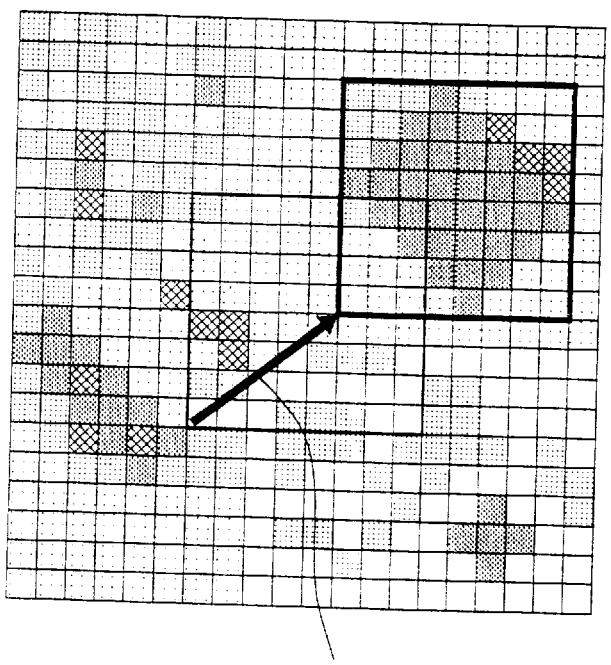
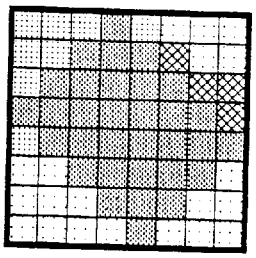

6,087,850

OPERATION CIRCUIT

BACKGROUND OF THE INVENTION

1. Field of the Invention

The present invention relates to an operation circuit such as an exclusive-OR circuit and an addition (subtraction) circuit, and more particularly to an operation circuit suitable for a motion vector detection device and the like.

2. Description of the Background Art

Among devices which use many operation circuits is a motion vector detection device. The motion vector detection device is an essential one in a compression device for dynamic image data using motion compensation, and among the typical algorithms using the motion compensation is MPEG (Moving Picture Experts Group) and the like. The motion vector detection device searches for a picture like the current picture (template data TB) among stored pictured (search window data SW) and outputs its position as a motion vector MV, as shown in FIG. 15. In developing the compression device for dynamic image data, the performance of the motion vector detection device has a great effect on that of the compression device for dynamic image data. As to the performance of the motion vector detection device, one of the key factors for high-quality image is detection of motion vector MV in searching wider range (wider search window).

FIG. 16 is a block diagram showing a constitution of a motion vector detection device using a block matching technique for detecting an optimum motion vector. A cache memory 40 stores the search window data SW and a cache memory 50 stores the template data TB. A systolic array 10 calculates an absolute difference of a specified area of the search window data SW and the template data TB in a unit of predetermined area of pixels (8 pixels×8 pixels in FIG. 15). An addition circuit 20 generates the sum of the absolute differences. A minimum-value detection circuit 30 stores the sum of the absolute differences. A vector generation unit 70 generates a motion vector of the specified area of the search window data SW and the template data TB and store it. Through repeating this operation with changes of the specified area of the search window data SW, a plurality of absolute differences are stored in the minimum-value detection circuit 30 and a plurality of motion vectors are stored in the vector generation unit 70. Then, the minimum-value detection circuit 30 selects one of the motion vectors stored in the vector generation unit 70 corresponding to the minimum one of the sums of the absolute differences stored in the minimum-value detection circuit 30 to output it as an optimum motion vector MV.

FIG. 17 is a block diagram showing a part which obtains the sum of the absolute differences and detects the minimum value. Reference numbers in FIG. 17 correspond to those of FIG. 16. As shown in FIG. 17, the systolic array 10 consists of sixty-four (8×8 pixels) processor elements PE for calculating the absolute difference and eight side registers SR. The processor elements PE are connected to one another in a linear systolic array. Each of the processor elements PE corresponds to each pixel in the template data TB. The template data TB are loaded into the systolic array 10 and each of the pixels is stored in each of registers in the processor elements PE. On the other hand, the search window data SW are stored in the eight side registers SR and eight pixels are shifted (loaded) from the eight side registers SR into eight of the processor elements PE to be stored therein. Each of the processor elements PE performs an arithmetic operation to obtain the absolute difference for one pixel of the search window data SW and the template data TB. This part repeats the above loading, storing and arithmetic operation while changing the specified area of the search window data SW.

Thus, the processor elements PE have both a data loading (shifting) function and a data storing function.

FIGS. 18 to 20 illustrate processor elements PE. Each processor element PE internally consists of a data shift unit TG for loading the template data TB and the search window data SW in synchronization with a clock CK, a register R for temporarily storing data and at least one of an exclusive-OR circuit EOR and an addition circuit ADD. Though the processor element PE may have both the exclusive-OR circuit EOR and the addition circuit ADD as shown in FIG. 20, the following discussion will be presented, taking a processor element PE having either the exclusive-OR circuit EOR or the addition circuit ADD as shown in FIG. 18 or 19 as an example since each of the exclusive-OR circuit EOR and the addition circuit ADD is practically used as a minimum function unit in many cases.

The exclusive-OR circuit EOR and the addition circuit ADD in the background art have circuit configurations of FIGS. 21 and 22, respectively. In the addition circuit, a difference-operation function can be implemented by supplying an inverted input to its one input. In FIGS. 21 and 22, the data shift unit TG is omitted, and so is in circuits discussed below.

The background-art exclusive-OR circuit EOR of FIGS. 21 and 22 is provided independently of the register R.

The operation circuit such as the exclusive-OR circuit and the addition circuit ADD in the background art have a problem of large circuit scale (H/W) in terms of hardware and function. When the background-art exclusive-OR circuit or addition circuit ADD is applied to the processor element PE, the systolic array 10 becomes huge because the number of processor elements PE corresponding to the number of pixels in the template data TB and the direction of quantization (the number of required bits per pixel). For example, if the template data TB has 8×8 pixels with 8 bits per pixel, 512 processor elements PE are needed.

SUMMARY OF THE INVENTION

The present invention is directed to an operation circuit for generating inverted values of first and second inputs to perform an exclusive-OR operation of the first and second inputs and the inverted values. According to a first aspect of the present invention, the operation circuit comprises: a first store unit for receiving and storing the first input; and at least one second store unit for receiving and storing the second input, and in the operation circuit, each of the first store unit and the at least one second store unit has a closed loop consisting of first and second inverters, an output of the first inverter in the first store unit is the inverted value of the first input, and an output of the first inverter in the at least one second store unit is the inverted value of the second input.

According to a second aspect of the present invention, the operation circuit of the first aspect further comprises: a selection unit for selecting one of the output of the first inverter and an output of the second inverter in the at least one second store unit in response to an output from the first store unit to output the one which is selected as an operation result of the exclusive-OR operation.

According to a third aspect of the present invention, the operation circuit of the first aspect further comprises: at least one output unit connected to a first potential, and in the operation circuit, each of the first store unit and the at least one second store unit includes a plurality of transistors each having a control electrode receiving an output from the closed loop, the plurality of transistors in the first store unit and the at least one second store unit constituting a decoder connected between the at least one output unit and a second potential and receiving the outputs of the first and second inverters in the first store unit and the at least one second store unit, for generating an operation result of the exclusive-OR operation of the outputs, and an output of the at least one output unit is the operation result of the exclusive-OR operation.

According to a fourth aspect of the present invention, in the operation circuit of the third aspect, the at least one second store unit includes a plurality of second store units, and the operation circuit further comprises a selection unit for selecting one of the plurality of second store units, and in the operation circuit, the plurality of transistors in the one of the plurality of second store units which is selected by the selection unit are connected between the at least one output unit and the second potential.

According to a fifth aspect of the present invention, in the operation circuit of the third aspect, the at least one output unit includes a plurality of output units, and the at least one second store unit includes a plurality of second store units.

The present invention is also directed to an operation circuit for generating inverted values of first to third inputs to perform a three-input addition of the first to third inputs and the inverted values. According to a sixth aspect of the present invention, the operation circuit comprises: a first store unit for receiving and storing the first input; at least one second store unit for receiving and storing the second input; and at least one third store unit for receiving and storing the third input, and in the operation circuit, each of the first store unit, the at least one second store unit and the at least one third store unit has a closed loop consisting of first and second inverters, an output of the first inverter in the first store unit is the inverted value of the first input, an output of the first inverter in the at least one second store unit is the inverted value of the second input, and an output of the first inverter in the at least one third store unit is the inverted value of the third input.

According to a seventh aspect of the present invention, the operation circuit of the sixth aspect further comprises: a first selection unit for selecting one of the output of the first inverter and an output of the second inverter in the at least one second store unit in response to an output from the first store unit to output the one which is selected, a second selection unit for selecting one of the output of the first inverter and an output of the second inverter in the at least one third store unit in response to an output from the first selection unit to output the one which is selected as a sum of the three-input addition, and a third selection unit for selecting one of an output from the at least one second store unit and an output from the at least one third store unit in response to the output from the first selection unit to output the one which is selected as a carry digit of the three-input addition.

According to an eighth aspect of the present invention, the operation circuit of the sixth aspect further comprises: at least one first output unit and at least one second output unit each connected to a first potential, and in the operation circuit, each of the first store unit, the at least one second store unit and the at least one third store unit includes a plurality of transistors each having a control electrode receiving an output from the closed loop, the plurality of transistors in the first store unit, the at least one second unit and the at least one third store unit constituting a decoder connected between the at least one first output unit and a second potential or between the at least one second output unit and the second potential and receiving the outputs of the first and second inverters in the first store unit, the at least one second store unit and the at least one third store unit, for generating an operation result of the three-input addition of the outputs, and outputs of the at least one first output unit and the at least one second output unit are a sum and a carry digit of the three-input addition, respectively.

According to a ninth aspect of the present invention, in the operation circuit of the eighth aspect, the at least one second store unit includes a plurality of second store units and the at least one third store unit includes a plurality of third store units, and the operation circuit further comprises a selection unit for selecting one of the plurality of second store units and one of the plurality of third store units, and in the operation circuit, the plurality of transistors in the one of the plurality of second store units and the one of the plurality of third store units which are selected by the selection unit are connected between the at least one first output unit and the second potential or between the at least one second output unit and the second potential.

According to a tenth aspect of the present invention, in the operation circuit of the eighth aspect, the at least one first output unit includes a plurality of first output units and the at least one second output unit includes a plurality of second output units, and the at least one second store unit includes a plurality of second store units and the at least one third store unit includes a plurality of third store units.

According to an eleventh aspect of the present invention, the operation circuit of the sixth aspect further comprises: at least one first output unit connected to a first potential, and in the operation circuit, each of the first store unit, the at least one second store unit and the at least one third store unit includes a plurality of transistors each having a control electrode receiving an output from the closed loop, the plurality of transistors in the first store unit, the at least one second store unit and the at least one third store unit constituting a decoder connected between the at least one first output unit and a second potential and receiving the outputs of the first and second inverters in the first store unit, the at least one second store unit and the at least one third store unit, for generating an operation result of the three-input addition of the outputs, and an output of the at least one first output unit is a sum of the three-input addition.

According to a twelfth aspect of the present invention, in the operation circuit of the eleventh aspect, the at least one second store unit includes a plurality of second store units and the at least one third store unit includes a plurality of third store units, and the operation circuit further comprises a selection unit for selecting one of the plurality of second store units and one of the plurality of third store units, and in the operation circuit, the plurality of transistors in the one of the plurality of second store units and the one of the plurality of third store units which are selected by the selection unit are connected between the at least one first output unit and the second potential.

According to a thirteenth aspect of the present invention, in the operation circuit of the eleventh aspect, the at least one first output unit includes a plurality of first output units, and the at least one second store unit includes a plurality of second store units and the at least one third store unit includes a plurality of third store units.

Since the operation circuit of the first aspect performs an exclusive-OR operation between the first and second inputs to output an operation result while storing the first and second inputs, an effect of reduction in circuit scale is achieved.

In the operation circuit of the second aspect, with the selection unit, an effect of simple circuit configuration is achieved.

In the operation circuit of the third aspect, since the transistors in the first and second store units constitute the decoder, an effect of simple circuit configuration is achieved.

In the operation circuit of the fourth aspect, the exclusive-OR operation between the first input and one of the second inputs and the loading of the other second input can be concurrently performed.

In the operation circuit of the fifth aspect, the storing and exclusive-OR operation of the first input and one of the second inputs and the storing and exclusive-OR operation of the first input and the other second input can be concurrently performed.

Since the operation circuit of the sixth aspect performs a three-input addition of the first, second and third inputs to output an operation result while storing the first, second and third inputs, an effect of reduction in circuit scale is achieved.

In the operation circuit of the seventh aspect, with the selection unit, an effect of simple circuit configuration is achieved.

In the operation circuit of the eighth aspect, since the transistors in the first and second store units constitute the decoder, an effect of simple circuit configuration is achieved.

In the operation circuit of the ninth aspect, the three-input addition of the first input, one of the second inputs and one of the third inputs and the loading of the other second input and the other third input can be concurrently performed.

In the operation circuit of the tenth aspect, the storing and three-input addition of the first input, one of the second inputs and one of the third inputs and the storing and three-input addition of the first input, the other second input and the other third input can be concurrently performed.

In the operation circuit of the eleventh aspect, since the transistors in the first and second store units constitute the decoder, an effect of simple circuit configuration is achieved.

In the operation circuit of the twelfth aspect, the three-input addition of the first input, one of the second inputs and one of the third inputs and the loading of the other second input and the other third input can be concurrently performed.

In the operation circuit of the thirteenth aspect, the storing and three-input addition of the first input, one of the second inputs and one of the third inputs and the storing and three-input addition of the first input, the other second input and the other third input can be concurrently performed.

An object of the present invention is to provide an operation circuit which allows reduction in circuit scale.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15 illustrates detection of a motion vector;

FIG. 16 is a block diagram showing a constitution of a motion vector detection device;

DESCRIPTION OF THE PREFERRED EMBODIMENTS

Operation circuits in all the preferred embodiments discussed below are preferably applied to the systolic array 10 in the motion vector detection device in the background art.

The First Preferred Embodiment

Figure 1:
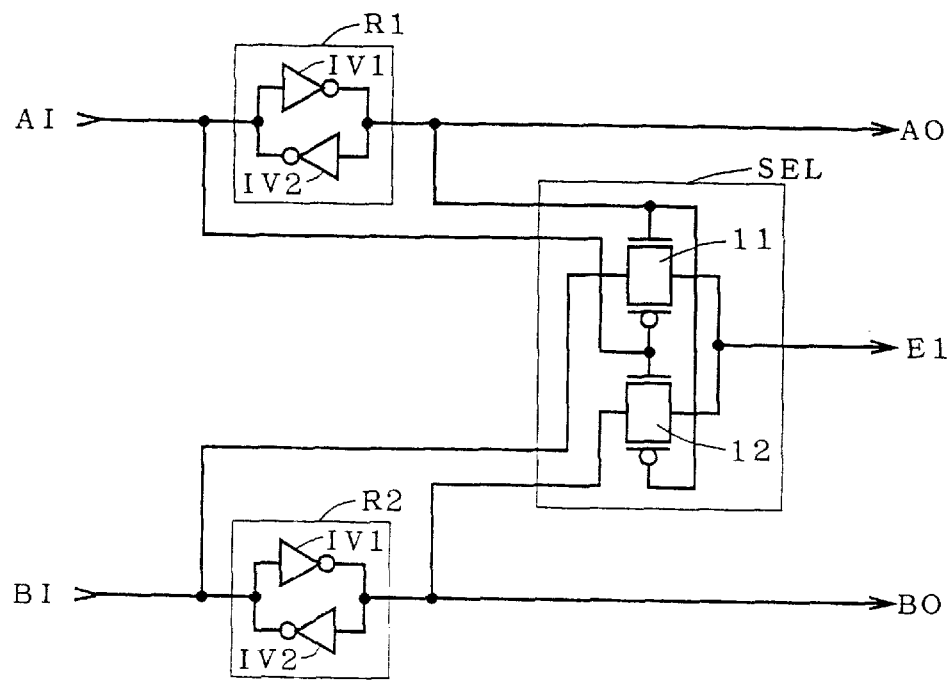
FIG. 1 is a circuit diagram of an operation circuit in accordance with a first preferred embodiment of the present invention.

FIG. 1 is a circuit diagram of an operation circuit in accordance with the first preferred embodiment of the present invention. The operation circuit of FIG. 1 is an exclusive-OR circuit for positive logic output (EX-OR). The first input AI, the second input BI, the first store unit R1 receiving the first input AI to store it, the second store unit R2 receiving the second input BI to store it and a selection unit SEL for outputting an exclusive-OR operation result E1 are shown in FIG. 1.

Now, discussion will be presented on a constitution of the operation circuit of the first preferred embodiment. In the first preferred embodiment, the first and second store units R1 and R2 each have a closed loop consisting of the first inverter IV1 and the second inverter IV2, and the selection unit SEL consists of transfer gates 11 and 12.

An output of the first inverter IV1 in the first store unit R1 is connected to a positive-logic control terminal of the transfer gate 11 and a negative-logic control terminal of the transfer gate 12. An output of the second inverter IV2 in the first store unit R1 is connected to a negative-logic control terminal of the transfer gate 11 and a positive-logic control terminal of the transfer gate 12.

An output of the first inverter IV1 in the second store unit R2 is connected to an input terminal of the transfer gate 12. An output of the second inverter IV2 in the second store unit R2 is connected to an input terminal of the transfer gate 11.

Output terminals of the transfer gates 11 and 12 are connected to each other and the potential at a point of this connection is outputted as the operation result E1.

Next discussion will be presented on an operation of the operation circuit of the first preferred embodiment. The first store unit R1, being a register of the closed loop consisting of the first and second inverters IV1 and IV2, stores the first input AI. An output of the second inverter IV2 is a value of the first input AI and an output of the first inverter IV1 is an inverted value of the first input AI.

Like the first store unit R1, the second store unit R2, being a register of the closed loop consisting of the first and second inverters IV1 and IV2, stores the second input BI. An output of the second inverter IV2 is a value of the second input BI and an output of the first inverter IV1 is an inverted value of the second input BI.

When an output AO from the first store unit R1 is "0" (the first input A1 is "1"), the selection unit SEL selects the output of the first inverter IV1 in the second store unit R2 (the inverted value of the second input BI) and outputs it as the operation result E1. In other words, the operation result E1 is "1" when the first input AI is "1" and the second input BI is "0", and the operation result E1 is "0" when the first input AI is "1" and the second input BI is "1". When the output AO is "1" (the first input A1 is "0"), the selection unit SEL selects the output of the second inverter IV2 in the second store unit R2 (the value of the second input BI) and outputs it as the operation result E1. In other words, the operation result E1 is "0" when the first input AI is "0" and the second input BI is "0", and the operation result E1 is "1" when the first input AI is "0" and the second input BI is "1". The operation result E1 is the exclusive OR of the first and second inputs AI and BI.

Thus, the operation circuit of the first preferred embodiment has functions of storing the first and second inputs AI and BI and performing the exclusive-OR operation.

Figure 21:
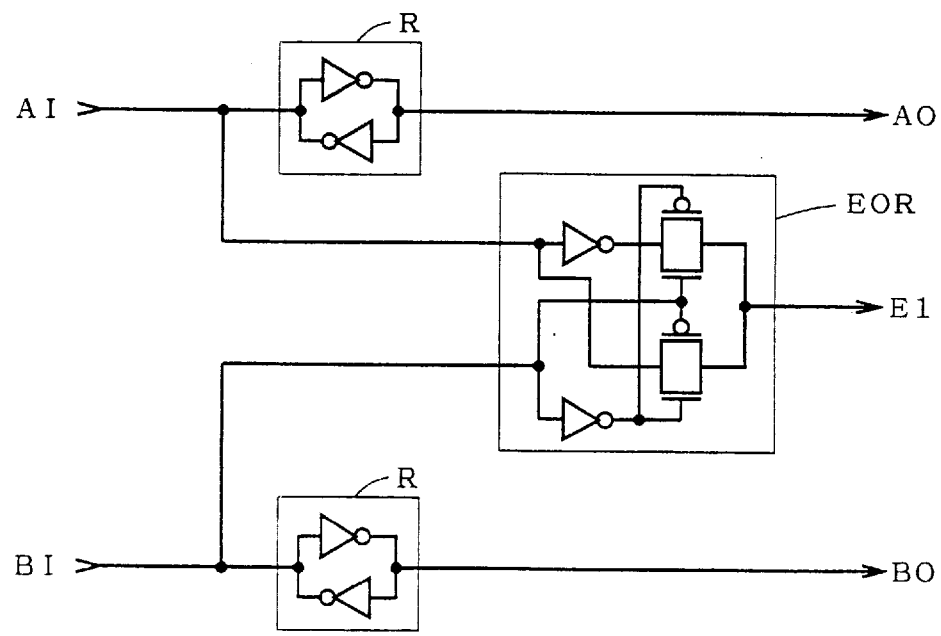
FIGS. 21 and 22 are circuit diagrams of an operation circuit in the background art.
Figure 22:
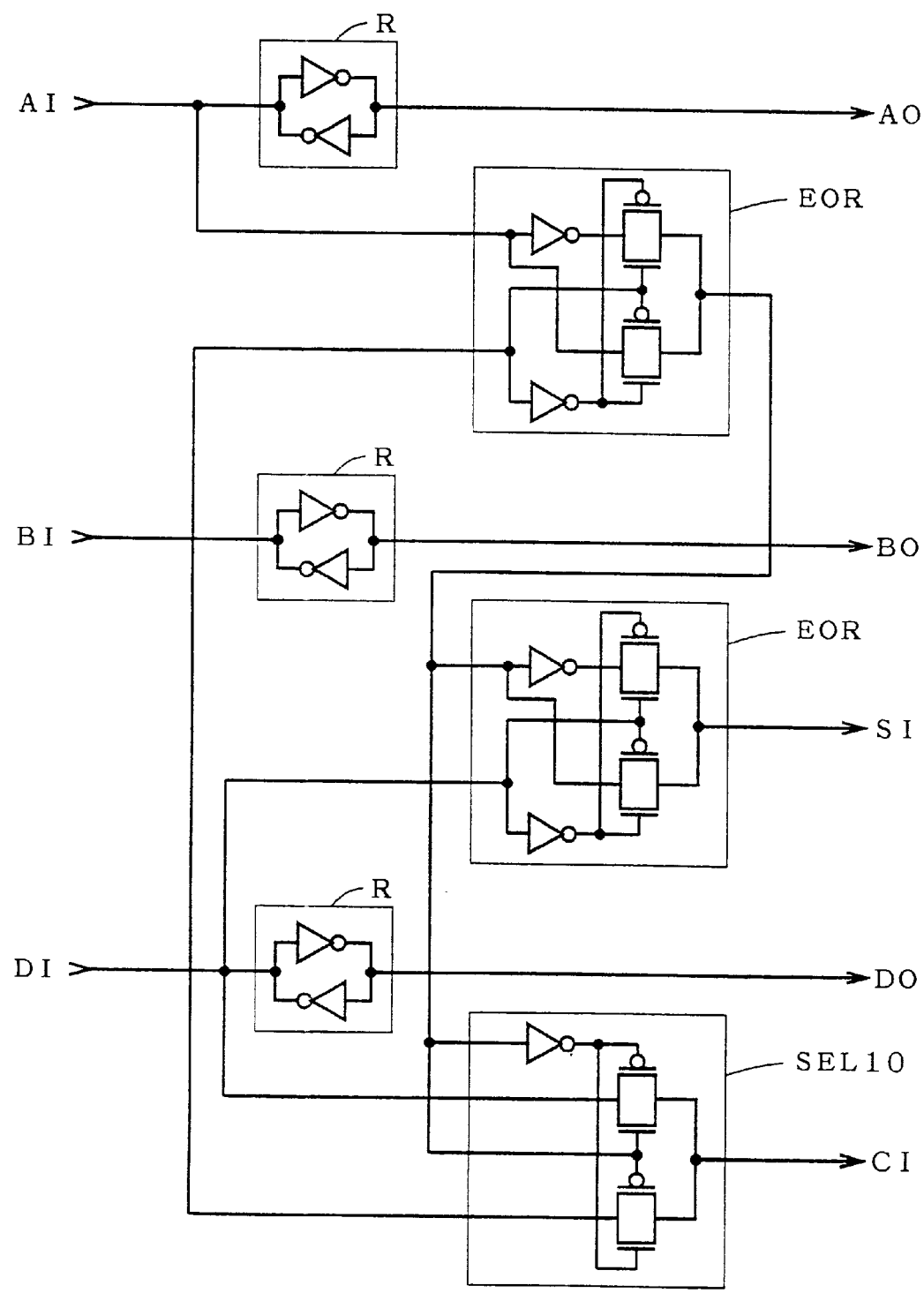

The first preferred embodiment produces such an effect as follows. The operation circuit of the first preferred embodiment, which has the function of the background-art store unit R (FIGS. 21 and 22) and an additional function of an exclusive-OR circuit and includes less inverters than those in the background art by two, allows reduction in circuit scale and power consumption. When the operation circuit of the first preferred embodiment is applied to each of the processor elements in the systolic array 10 discussed in the background art, a great number of inverters are cut as compared with the background art, and therefore significant reduction in circuit scale and power consumption can be achieved.

The Second Preferred Embodiment

Figure 2:
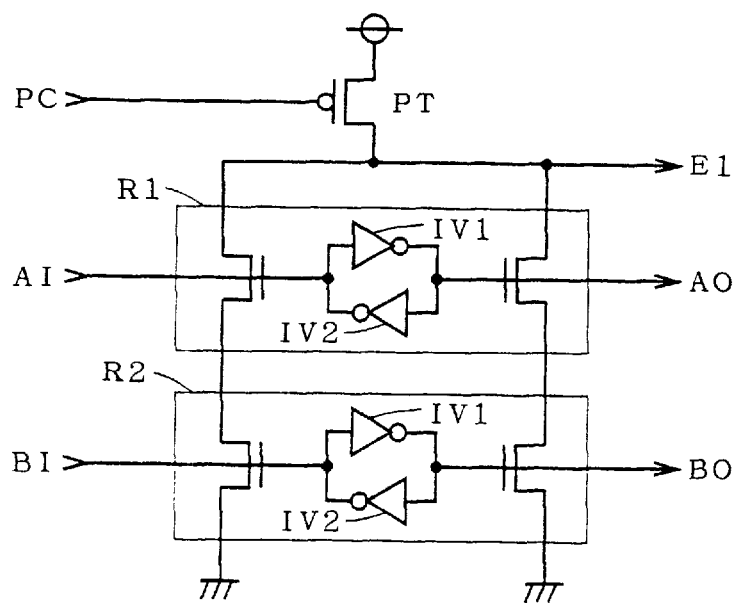
FIG. 2 is a circuit diagram of an operation circuit in accordance with a second preferred embodiment of the present invention.

FIG. 2 is a circuit diagram of an operation circuit in accordance with the second preferred embodiment of the present invention. The operation circuit of FIG. 2 is an exclusive-OR circuit for positive logic output (EX-OR). The first input AI, the second input BI, the first store unit R1 receiving the first input AI to store it, the second store unit R2 receiving the second input BI to store it, the exclusive-OR operation result E1, a PMOS transistor PT serving as an output unit and a control line PC are shown in FIG. 2.

Now, discussion will be presented on a constitution of the operation circuit of the second preferred embodiment. In the second preferred embodiment, the first and second store units R1 and R2 each have a closed loop consisting of two NMOS transistors (pass transistors) and the first and second inverters IV1 and IV2.

An output of the first inverter IV1 in the first store unit R1 is connected to a gate electrode (control electrode) of one of the two NMOS transistors. An output of the second inverter IV2 in the first store unit R1 is connected to a gate electrode of the other NMOS transistor.

An output of the first inverter IV1 in the second store unit R2 is connected to a gate electrode of one of the two NMOS transistors. An output of the second inverter IV2 in the second store unit R2 is connected to a gate electrode of the other NMOS transistor.

The transistor PT has a drain connected to a power supply and a gate electrode connected to the control line PC. Between the source of the transistor PT and the ground, there are two kinds of paths. Specifically, one path goes through the NMOS transistor connected to the output of the first inverter IV1 in the first store unit R1 and the NMOS transistor connected to the output of the first inverter IV1 in the second store unit R2 and the other goes through the NMOS transistor connected to the output of the second inverter IV2 in the first store unit R1 and the NMOS transistor connected to the output of the second inverter IV2 in the second store unit R2.

In each of the NMOS transistors in the first and second store units R1 and R2, the drain is connected to the power supply and the source is connected to the ground. The potential at the source of the transistor PT is outputted as the operation result E1.

The transistor PT has a current driving capability lower than that of each transistor in the first and second store units R1 and R2.

Next discussion will be presented on an operation of the operation circuit of the second preferred embodiment. The first store unit R1, being a register of the closed loop consisting of the first and second inverters IV1 and IV2, stores the first input AI. The output of the second inverter IV2 is the value of the first input AI and the output of the first inverter IV1 is the inverted value of the first input AI.

Like the first store unit R1, the second store unit R2, being a register of the closed loop consisting of the first and second inverters IV1 and IV2, stores the second input BI. The output of the second inverter IV2 is the value of the second input BI and the output of the first inverter IV1 is the inverted value of the second input BI.

All in the first and second store units R1 and R2 constitute a decoder for outputting the exclusive-OR operation result in response to the combination of the outputs from the first and second inverters IV1 and IV2. Because of the lower current driving capability of the transistor PT, the source potential of the transistor PT is drawn to "0" when the transistors in the first and second store units R1 and R2 are brought into conduction.

The second preferred embodiment produces such an effect as follows. The operation circuit of the second preferred embodiment, which has the function of the background-art store unit R and an additional function of an exclusive-OR circuit and includes less transistors than those in the background art by three when two transistors constitute an inverter, allows reduction in circuit scale. When the operation circuit of the second preferred embodiment is applied to each of the processor elements in the systolic array 10 discussed in the background art, a great number of inverters are cut as compared with the background art, and therefore significant reduction in circuit scale and power consumption can be achieved.

The Third Preferred Embodiment

Figure 3:
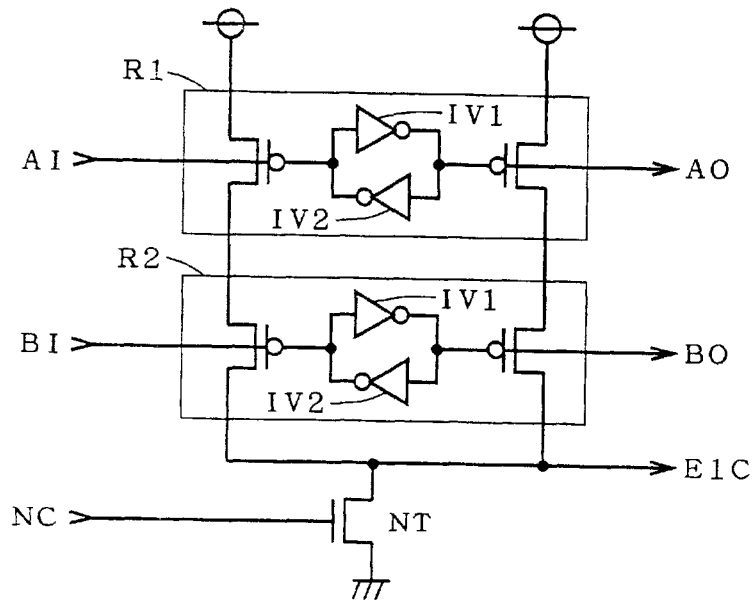
FIG. 3 is a circuit diagram of an operation circuit in accordance with a third preferred embodiment of the present invention.

FIG. 3 is a circuit diagram of an operation circuit in accordance with the third preferred embodiment of the present invention. The operation circuit of FIG. 3 is an exclusive-OR circuit for negative logic output (EX-NOR). An exclusive-OR operation result E1C, an NMOS transistor NT serving as an output unit and a control line NC are shown in FIG. 3. The elements in FIG. 3 other than the above correspond to those with the same reference signs in FIG. 2.

The operation circuit of the third preferred embodiment has a constitution which is a logically-inverted one of the operation circuit of the second preferred embodiment. Specifically, in the constitution of the operation circuit of the third preferred embodiment, the NMOS transistors in the first and second store units R1 and R2, the transistor PT, the control line PC, the ground and the power supply in the operation circuit of the second preferred embodiment are replaced by the PMOS transistors in the first and second store units R1 and R2, the transistor NT, the control line NC, the power supply and the ground, respectively.

The third preferred embodiment produces the same effect as the second preferred embodiment.

The Forth Preferred Embodiment

Figure 4:
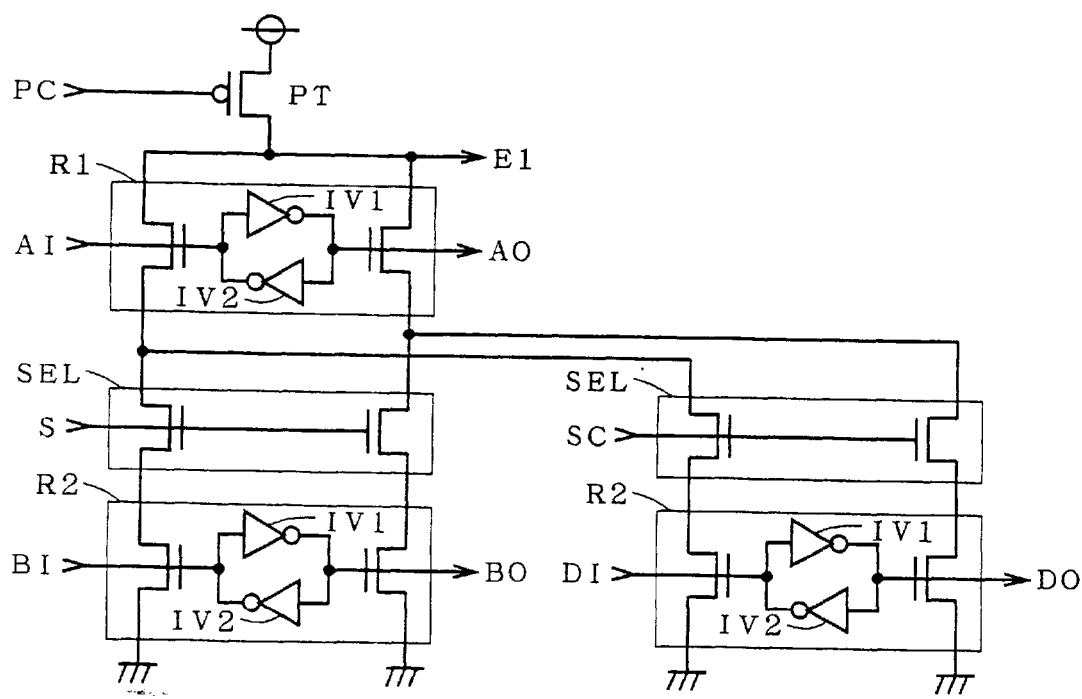
FIG. 4 is a circuit diagram of an operation circuit in accordance with a fourth preferred embodiment of the present invention.

FIG. 4 is a circuit diagram of an operation circuit in accordance with the fourth preferred embodiment of the present invention. The operation circuit of FIG. 4 is an exclusive-OR circuit for positive logic output (EX-OR) having a time-division function. The selection units SEL, complementary selection signals S and SC, the third input DI are shown in FIG. 4. The elements in FIG. 4 other than the above correspond to those with the same reference signs in FIG. 2.

The operation circuit of the fourth preferred embodiment includes the second store unit R2 for the third input DI and the selection units SEL in addition to the constitution of the operation circuit of the second preferred embodiment. Each of the selection units SEL is provided between the fist store unit R1 and each of the two second store units R2.

The operation circuit of the fourth preferred embodiment primarily performs the same operation as the second preferred embodiment and additionally has the time-division function. Specifically, by setting "1" to the selection signal S, the result E1 of the exclusive-OR operation between the first input AI and the second input BI is outputted to a subsequent circuit (arithmetic operation of data) while the third input DI is loaded into the second store unit R2 for the third input DI and stored therein (loading and storing data). Next, by setting "1" to the selection signal SC, the result E1 of the exclusive-OR operation between the first input AI and the third input DI is outputted to a subsequent circuit while the second input BI is loaded into the second store unit R2 and stored therein. Thus, outputting the exclusive-OR operation result and loading of data can be concurrently performed.

The fourth preferred embodiment produces such an effect as follows. The time-division function allows reduction in processing time. When the operation circuit of the fourth preferred embodiment is applied to each of the processor elements in the systolic array 10 discussed in the background art, the operating speed becomes higher because the loading and storing and the arithmetic operation can be concurrently performed in the repetition of loading, storing and arithmetic operation as discussed in the background art.

The Fifth Preferred Embodiment

Figure 5:
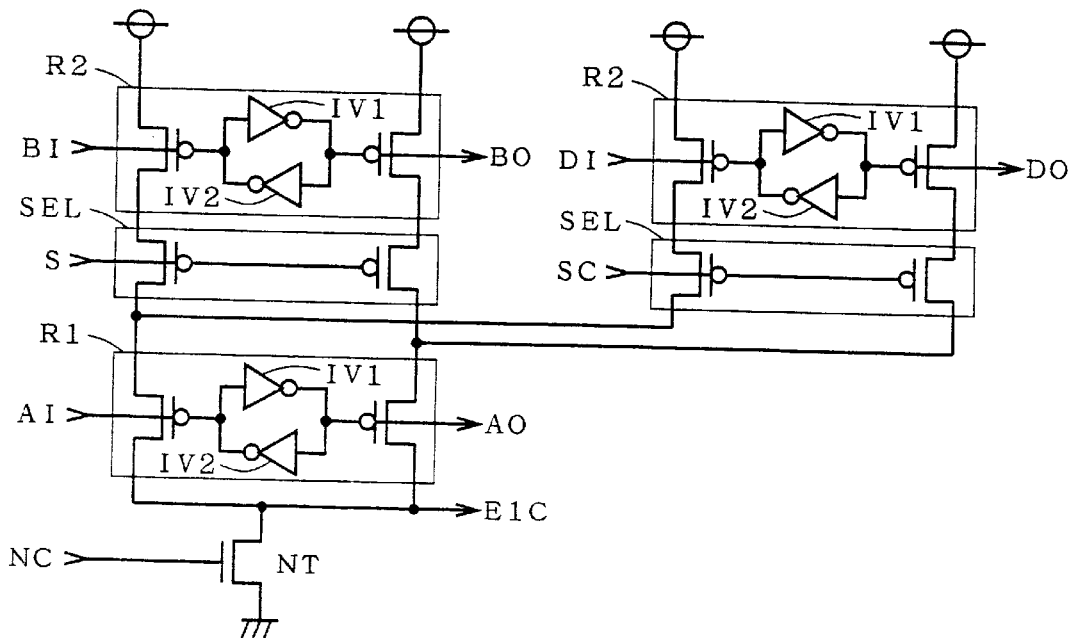
FIG. 5 is a circuit diagram of an operation circuit in accordance with a fifth preferred embodiment of the present invention.

FIG. 5 is a circuit diagram of an operation circuit in accordance with the fifth preferred embodiment of the present invention. The operation circuit of FIG. 5 is an exclusive-OR circuit for negative logic output (EX-NOR) having the time-division function. The exclusive-OR operation result E1C, the NMOS transistor NT serving as an output unit and the control line NC are shown in FIG. 5. The elements in FIG. 5 other than the above correspond to those with the same reference signs in FIG. 4.

The operation circuit of the fifth preferred embodiment has a constitution which is a logically-inverted one of the operation circuit of the fourth preferred embodiment. Specifically, in the constitution of the operation circuit of the fifth preferred embodiment, the NMOS transistors in the first store unit R1 and the two second store units R2, the transistor PT, the control line PC, the ground and the power supply in the operation circuit of the fourth preferred embodiment are replaced by the PMOS transistors in the first store unit R1 and the two second store units R2, the transistor NT, the control line NC, the power supply and the ground, respectively.

The fifth preferred embodiment produces the same effect as the fourth preferred embodiment, except that the result of the exclusive-OR operation between the first input AI and the second input BI is obtained when "0" is set to the selection signal S and the result of the exclusive-OR operation between the first input AI and the third input DI is obtained when "0" is set to the selection signal SC.

The Sixth Preferred Embodiment

Figure 6:
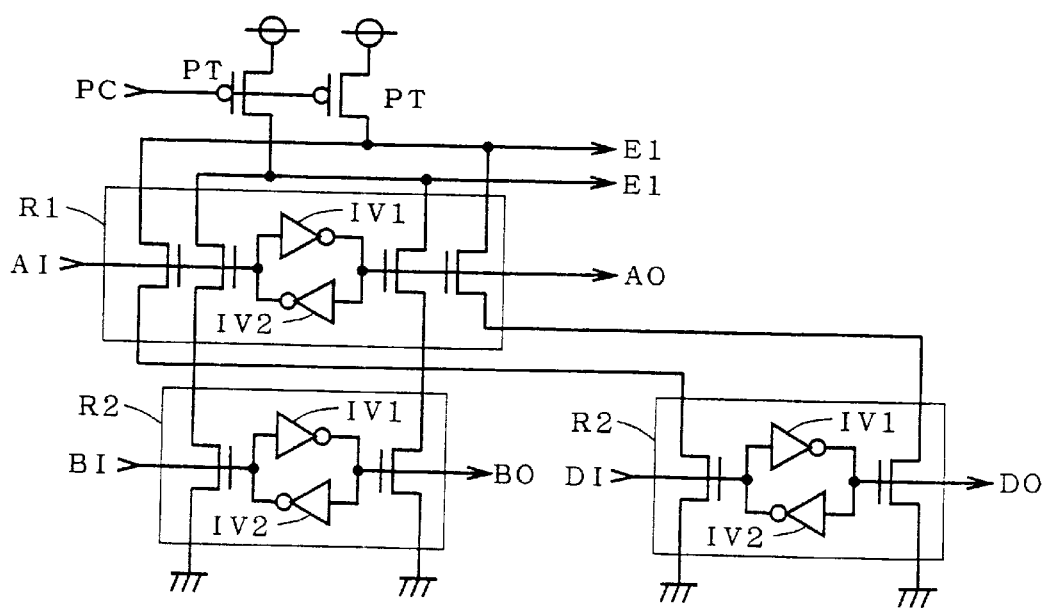
FIG. 6 is a circuit diagram of an operation circuit in accordance with a sixth preferred embodiment of the present invention.

FIG. 6 is a circuit diagram of an operation circuit in accordance with the sixth preferred embodiment of the present invention. The operation circuit of FIG. 6 is an exclusive-OR circuit for positive logic output (EX-OR) having a parallel-processing function. The third input DI is shown in FIG. 6, and the elements in FIG. 6 other than the above correspond to those with the same reference signs in FIG. 2.

The operation circuit of the sixth preferred embodiment includes the second store unit R2 for the third input DI, another transistor PT and two more NMOS transistors in the first store unit R1 in addition to the constitution of the operation circuit of the second preferred embodiment. The first store unit R1 is provided between the two transistors PT and the two second store units R2. There are two operation results E1.

The operation circuit of the sixth preferred embodiment primarily performs the same operation as the second preferred embodiment and additionally has the parallel-processing function. Specifically, the second input BI and the third input DI are concurrently loaded into the two second store units R2, respectively, and stored therein, and the result E1 of the exclusive-OR operation between the first input AI and the second input BI and the result E1 of the exclusive-OR operation between the first input AI and the third input DI are concurrently outputted.

The sixth preferred embodiment produces such an effect as follows. The parallel-processing function allows reduction in processing time. When the operation circuit of the sixth preferred embodiment is applied to each of the processor elements in the systolic array 10 discussed in the background art, the operating speed becomes higher because the loading, storing and arithmetic operation can be concurrently performed on two specified areas in the search window data SW.

The Seventh Preferred Embodiment

Figure 7:
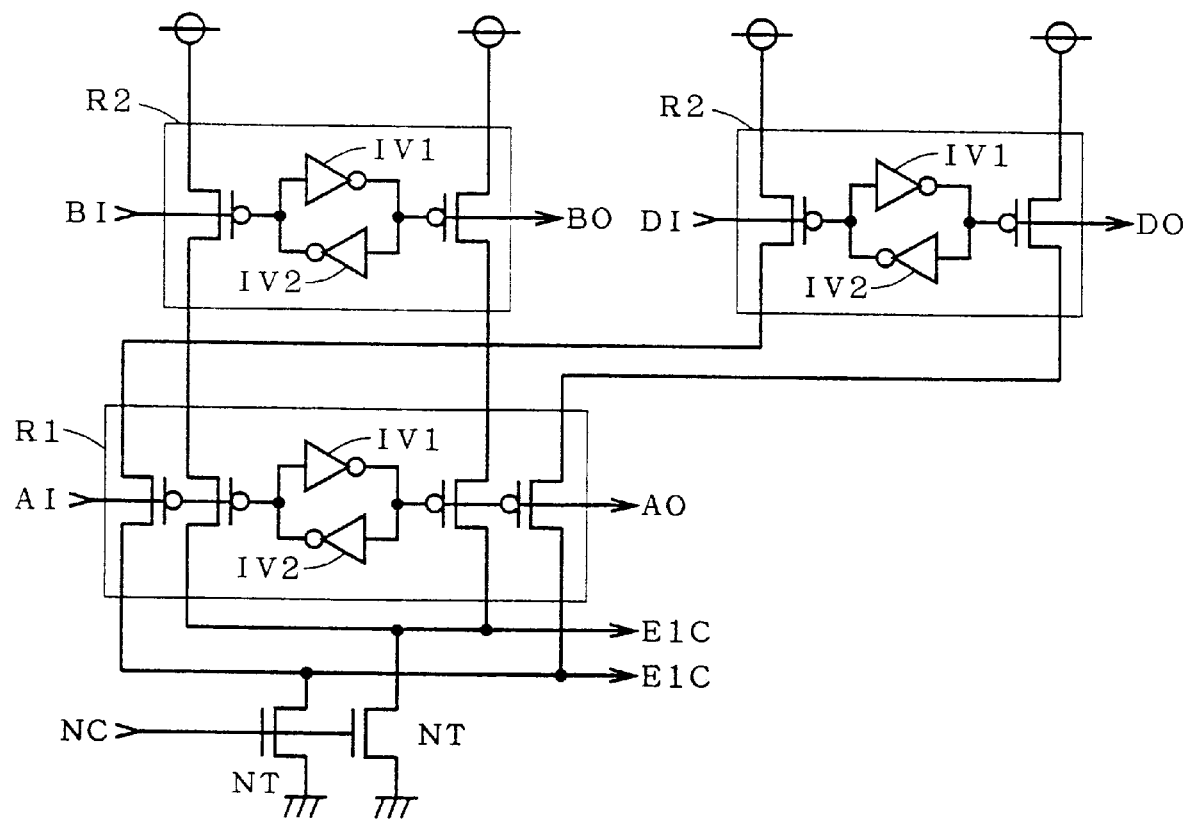
FIG. 7 is a circuit diagram of an operation circuit in accordance with a seventh preferred embodiment of the present invention.

FIG. 7 is a circuit diagram of an operation circuit in accordance with the seventh preferred embodiment of the present invention. The operation circuit of FIG. 7 is an exclusive-OR circuit for negative logic output (EX-NOR) having the parallel-processing function. The exclusive-OR operation results E1C, the NMOS transistors NT serving as output units and the control line NC are shown in FIG. 7. The elements in FIG. 7 other than the above correspond to those with the same reference signs in FIG. 6.

The operation circuit of the seventh preferred embodiment has a constitution which is a logically-inverted one of the operation circuit of the sixth preferred embodiment. Specifically, in the constitution of the operation circuit of the seventh preferred embodiment, the NMOS transistors in the first store unit R1 and the two second store units R2, the transistors PT, the control line PC, the ground and the power supply in the operation circuit of the sixth preferred embodiment are replaced by the PMOS transistors in the first store unit R1 and the two second store units R2, the transistors NT, the control line NC, the power supply and the ground, respectively.

The seventh preferred embodiment produces the same effect as the sixth preferred embodiment.

The Eighth Preferred Embodiment

Figure 8:
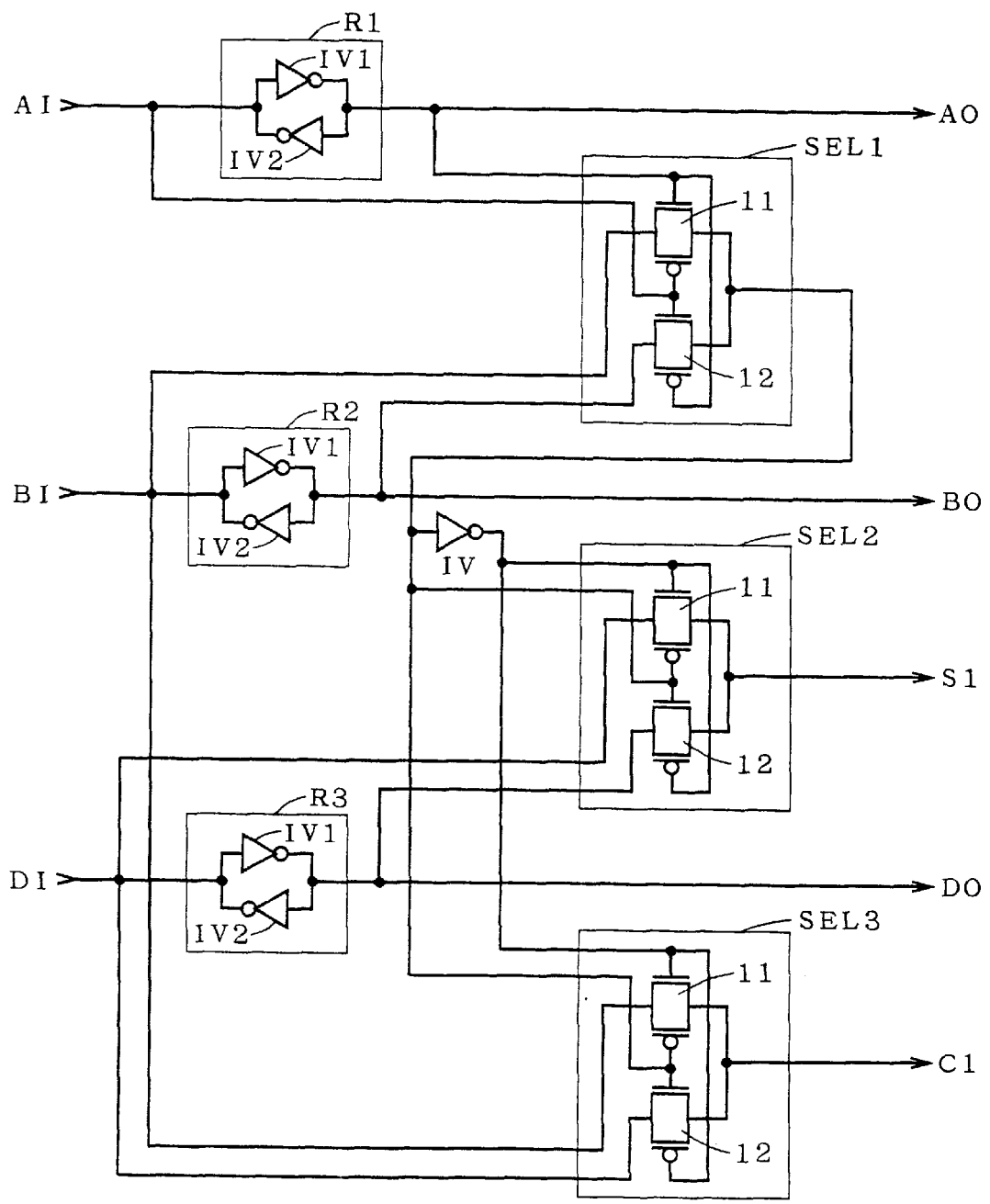
FIG. 8 is a circuit diagram of an operation circuit in accordance with an eighth preferred embodiment of the present invention.

FIG. 8 is a circuit diagram of an operation circuit in accordance with the eighth preferred embodiment of the present invention. The operation circuit of FIG. 8 is a three-input adder (full adder) circuit for positive logic output. The first input AI, the second input BI, the third input DI, the first store unit R1 receiving the first input AI to store it, the second store unit R2 receiving the second input BI to store it, the third store unit R3 receiving the third input DI to store it, an addition output (a sum) S1 which is one of operation results of the three-input addition, a carry output (a carry digit) C1 which is one of the operation results of the three-input addition, the first selection unit SEL1, the second selection unit SEL2 for outputting the addition output S1, the third selection unit SEL3 for outputting the carry output C1 and an inverter IV are shown in FIG. 8.

Now, discussion will be presented on a constitution of the operation circuit of the eighth preferred embodiment. In the eighth embodiment, the first, second and third store units R1, R2 and R3 each have a closed loop consisting of the first inverter IV1 and the second inverter IV2, and the first, second and third selection units SEL1, SEL2 and SEL3 each consists of transfer gates 11 and 12.

An output of the first inverter IV1 in the first store unit R1 is connected to a positive-logic control terminal of the transfer gate 11 in the first selection unit SEL1 and a negative-logic control terminal of the transfer gate 12 in the first selection unit SEL1. An output of the second inverter IV2 in the first store unit R1 is connected to a negative-logic control terminal of the transfer gate 11 in the first selection unit SEL1 and a positive-logic control terminal of the transfer gate 12 in the first selection unit SEL1.

An output of the first inverter IV1 in the second store unit R2 is connected to an input terminal of the transfer gate 12 in the first selection unit SEL1. An output of the second inverter IV2 in the second store unit R2 is connected to an input terminal of the transfer gate 11 in the first selection unit SEL1 and an input terminal of the transfer gate 11 in the third selection unit SEL3.

An output of the first inverter IV1 in the third store unit R3 is connected to an input terminal of the transfer gate 12 in the second selection unit SEL2. An output of the second inverter IV2 in the third store unit R3 is connected to an input terminal of the transfer gate 11 in the second selection unit SEL2 and an input terminal of the transfer gate 12 in the third selection unit SEL3.

Output terminals of the transfer gates 11 and 12 in the first selection unit SEL1 are connected to each other. Output terminals of the transfer gates 11 and 12 in the second selection unit SEL2 are connected to each other, and the potential at a point of this connection is outputted as the addition output S1. Output terminals of the transfer gates 11 and 12 in the third selection unit SEL3 are connected to each other, and the potential at a point of this connection is outputted as the carry output C1.

An output of the first selection unit SEL1 is connected to an input terminal of the inverter IV, a negative-logic control terminal of the transfer gate 11 in the second selection unit SEL2, a positive-logic control terminal of the transfer gate 12 in the second selection unit SEL2, a negative-logic control terminal of the transfer gate 11 in the third selection unit SEL3 and a positive-logic control terminal of the transfer gate 12 in the third selection unit SEL3.

An output terminal of the inverter IV is connected to a positive-logic control terminal of the transfer gate 11 in the second selection unit SEL2, a negative-logic control terminal of the transfer gate 12 in the second selection unit SEL2, a positive-logic control terminal of the transfer gate 11 in the third selection unit SEL3 and a negative-logic control terminal of the transfer gate 12 in the third selection unit SEL3.

Next discussion will be presented on an operation of the operation circuit of the eighth preferred embodiment. The first store unit R1, being a register of the closed loop consisting of the first and second inverters IV1 and IV2, stores the first input AI. The output of the second inverter IV2 is the value of the first input AI and the output of the first inverter IV1 is the inverted value of the first input AI.

The second store unit R2 works like the first store unit R1. Specifically, the second store unit R2, being a register of the closed loop consisting of the first and second inverters IV1 and IV2, stores the second input BI. The output of the second inverter IV2 is the value of the second input BI and the output of the first inverter IV1 is the inverted value of the second input BI.

The third store unit R3 works like the first store unit R1. Specifically, the third store unit R3, being a register of the closed loop consisting of the first and second inverters IV1 and IV2, stores the third input DI. The output of the second inverter IV2 is the value of the third input DI and the output of the first inverter IV1 is the inverted value of the third input DI.

The first selection unit SEL1 performs the same operation as the selection unit SEL of the first preferred embodiment, and the output of the first selection unit SEL1 is an exclusive-OR between the first input AI and the second input BI.

The second selection unit SEL2 is assumed to perform the same operation as the first selection unit SEL1, and the addition output S1 is an exclusive-OR between the output of the first selection unit SEL1 and the third input DI. Specifically, the addition output S1 is "0" when the first input AI is "0", the second input BI is "0" and the third input DI is "0", the addition output S1 is "1" when the first input AI is "1", the second input BI is "0" and the third input DI is "0", the addition output S1 is "1" when the first input AI is "0", the second input BI is "1" and the third input DI is "0", the addition output S1 is "0" when the first input AI is "1", the second input BI is "1" and the third input DI is "0", the addition output S1 is "1" when the first input AI is "0", the second input BI is "0" and the third input DI is "1", the addition output S1 is "0" when the first input AI is "1", the second input BI is "0" and the third input DI is "1", the addition output S1 is "0" when the first input AI is "0", the second input BI is "1" and the third input DI is "1" and the addition output S1 is "1" when the first input AI is "1", the second input BI is "1" and the third input DI is "1".

When the output of the first selection unit SEL1 is "0", the third selection unit SEL3 selects the output of the second inverter IV2 in the second store unit R2 (the second input BI) to output it as the carry output C1. Further, when the output of the first selection unit SEL1 is "1", the third selection unit SEL3 selects the output of the second inverter IV2 in the third store unit R3 (the third input DI) to output it as the carry output C1. Specifically, the carry output C1 is "0" when the first input AI is "0", the second input BI is "0" and the third input DI is "0", the carry output C1 is "0" when the first input AI is "1", the second input BI is "0" and the third input DI is "0", the carry output C1 is "0" when the first input AI is "0", the second input BI is "1" and the third input DI is "0", the carry output C1 is "1" when the first input AI is "1", the second input BI is "1" and the third input DI is "0" the carry output C1 is "0" when the first input AI is "0", the second input BI is "0" and the third input DI is "1", the carry output C1 is "1" when the first input AI is "1" the second input BI is "0" and the third input DI is "1", the carry output C1 is "1" when the first input AI is "0", the second input BI is "1" and the third input DI is "1" and the carry output C1 is "1" when the first input AI is "1", the second input BI is "1" and the third input DI is "1".

Thus, the operation circuit of the eighth preferred embodiment has a function of storing the first, second and third inputs AI, BI and DI and a function of performing a three-input addition.

The eighth preferred embodiment produces such an effect as follows. The operation circuit of the eighth preferred embodiment, which has the function of the store unit R in the background art of FIG. 22 and an additional function of a three-input adder circuit consisting of the exclusive-OR circuits EOR and the selection unit SEL10 in the background art of FIG. 22 and includes less inverters than those in the background art by four, allows reduction in circuit scale. When the operation circuit of the eighth preferred embodiment is applied to each of the processor elements in the systolic array 10 discussed in the background art, a great number of inverters are cut as compared with the background art, and therefore significant reduction in circuit scale and power consumption can be achieved.

The Ninth Preferred Embodiment

Figure 9:
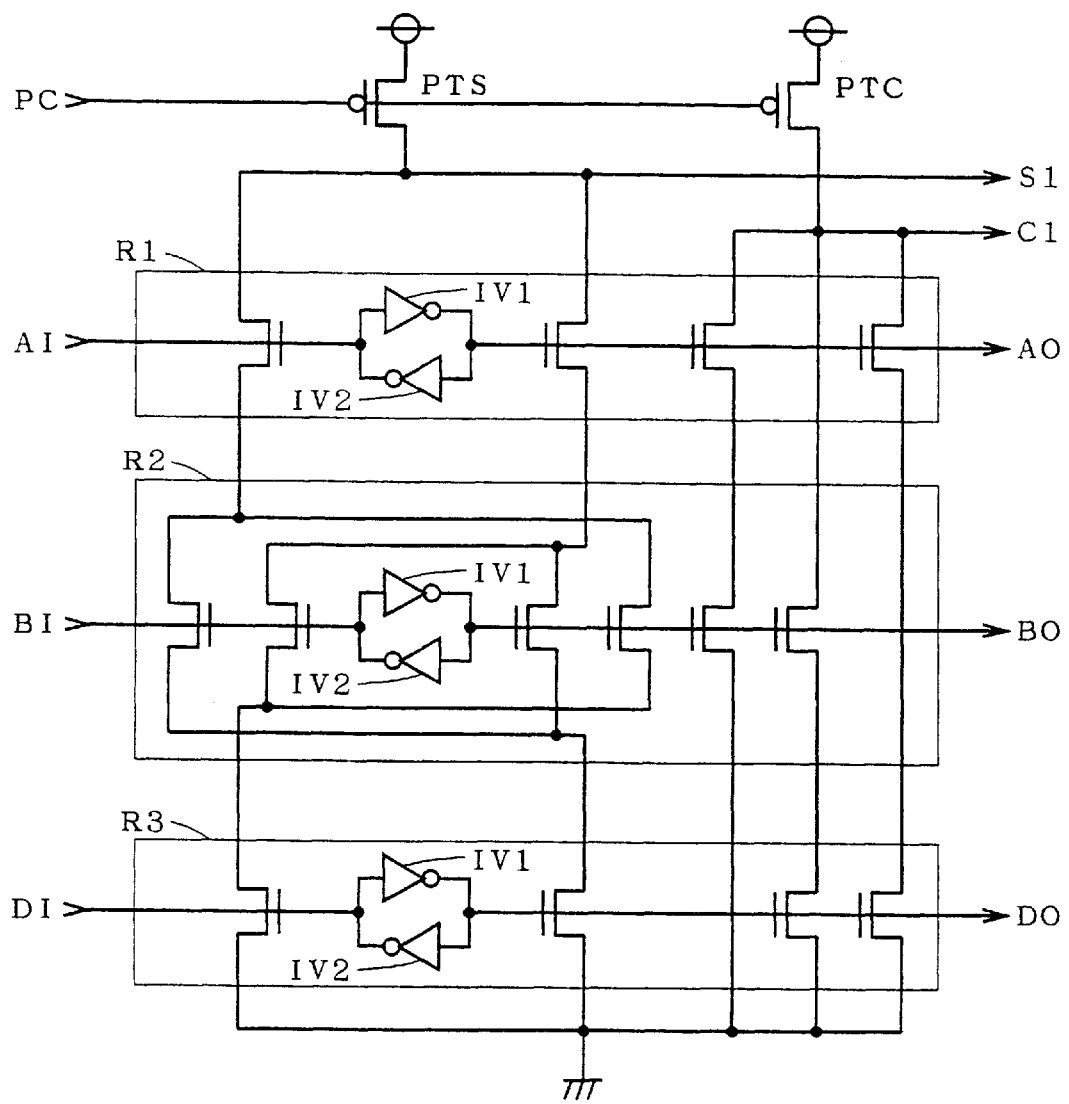
FIG. 9 is a circuit diagram of an operation circuit in accordance with a ninth preferred embodiment of the present invention.

FIG. 9 is a circuit diagram of an operation circuit in accordance with the ninth preferred embodiment of the present invention. The operation circuit of FIG. 9 is a three-input adder circuit. The first input AI, the second input BI, the third input DI, the first store unit R1 receiving the first input AI to store it, the second store unit R2 receiving the second input BI to store it, the third store unit R3 receiving the third input DI to store it, the addition output S1 which is one of the operation results of the three-input addition, the carry output C1 which is one of the operation results of the three-input addition, a PMOS transistor PTS serving as the first output unit, a PMOS transistor PTC serving as the second output unit and the control line PC are shown in FIG. 9.

Now, discussion will be presented on a constitution of the operation circuit of the ninth preferred embodiment. In the operation circuit of the ninth preferred embodiment, the first, second and third store units R1, R2 and R3 have four, six and four transistors, respectively, and each have a closed loop consisting of the first inverter IV1 and the second inverter IV2.

An output of the first inverter IV1 in the first store unit R1 is connected to gate electrodes of three transistors. An output of the second inverter IV2 in the first store unit R1 is connected to a gate electrode of a transistor.

An output of the first inverter IV1 in the second store unit R2 is connected to gate electrodes of four transistors. An output of the second inverter IV2 in the second store unit R2 is connected to gate electrodes of two transistors.

An output of the first inverter IV1 in the third store unit R3 is connected to gate electrodes of three transistors. An output of the second inverter IV2 in the third store unit R3 is connected to a gate electrode of a transistor.

The transistor PTS has a drain connected to the power supply and a gate electrode connected to the control line PC. There are four kinds of paths between the source of the transistor PTS and the ground. Specifically, the first path goes through the transistor connected to the output of the second inverter IV2 in the first store unit R1, the transistor connected to the output of the second inverter IV2 in the second store unit R2 and the transistor connected to the output of the first inverter IV1 in the third store unit R3, the second path goes through the transistor connected to the output of the second inverter IV2 in the first store unit R1, the transistor connected to the output of the first inverter IV1 in the second store unit R2 and the transistor connected to the output of the second inverter IV2 in the third store unit R3, the third path goes through the transistor connected to the output of the first inverter IV1 in the first store unit R1, the transistor connected to the output of the second inverter IV2 in the second store unit R2 and the transistor connected to the output of the second inverter IV2 in the third store unit R3 and the fourth path goes through the transistor connected to the output of the first inverter IV1 in the first store unit R1, the transistor connected to the output of the first inverter IV1 in the second store unit R2 and the transistor connected to the output of the first inverter IV1 in the third store unit R3.

The transistor PTC has a drain connected to the power supply and a gate electrode connected to the control line PC. There are three kinds of paths between the source of the transistor PTC and the ground. Specifically, the first path goes through the transistor connected to the output of the first inverter IV1 in the first store unit R1 and the transistor connected to the output of the first inverter IV1 in the second store unit R2, the second path goes through the transistor connected to the output of the first inverter IV1 in the second store unit R2 and the transistor connected to the output of the first inverter IV1 in the third store unit R3 and the third path goes through the transistor connected to the output of the first inverter IV1 in the first store unit R1 and the transistor connected to the output of the first inverter IV1 in the third store unit R3.

Each of the transistors in the first, second and third store units R1, R2 and R3 has a drain connected to the power supply and a source connected to the ground. The potential at the source of the transistor PTS is outputted as the addition output S1. The potential at the source of the transistor PTC is outputted as the carry output C1.

The transistors PTS and PTC each has a current driving capability lower than that of each transistor in the first, second and third store units R1, R2 and R3.

Next discussion will be presented on an operation of the operation circuit of the ninth preferred embodiment. The first store unit R1, being a register of the closed loop consisting of the first and second inverters IV1 and IV2, stores the first input AI. The output of the second inverter IV2 is the value of the first input AI and the output of the first inverter IV1 is the inverted value of the first input AI.

The second store unit R2 works like the first store unit R1. Specifically, the second store unit R2, being a register of the closed loop consisting of the first and second inverters IV1 and IV2, stores the second input BI. The output of the second inverter IV2 is the value of the second input BI and the output of the first inverter IV1 is the inverted value of the second input BI.

The third store unit R3 works like the first store unit R1. Specifically, the third store unit R3, being a register of the closed loop consisting of the first and second inverters IV1 and IV2, stores the third input DI. The output of the second inverter IV2 is the value of the third input DI and the output of the first inverter IV1 is the inverted value of the third input DI.

All the transistors in the first, second and third store units R1, R2 and R3 constitute a decoder for outputting the three-input addition result in response to the combination of the outputs from the first and second inverters IV1 and IV2. Because of the lower current driving capability of the transistors PTS and PTC, the source potentials of the transistors PTS and PTC are drawn to "0" when the transistors in the first, second and third store units R1, R2 and R3 are brought into conduction.

The ninth preferred embodiment produces such an effect as follows. The operation circuit of the ninth preferred embodiment, which has the function of the store unit R in the background art of FIG. 22 and the function of the exclusive-OR circuits EOR in the background art of FIG. 22 and includes less inverters than those in the background art of FIG. 22 by six when two transistors constitute an inverter, allows reduction in circuit scale. When the operation circuit of the ninth preferred embodiment is applied to each of the processor elements in the systolic array 10 discussed in the background art, a great number of inverters are cut as compared with the background art, and therefore significant reduction in circuit scale and power consumption can be achieved.

The Tenth Preferred Embodiment

Figure 10:
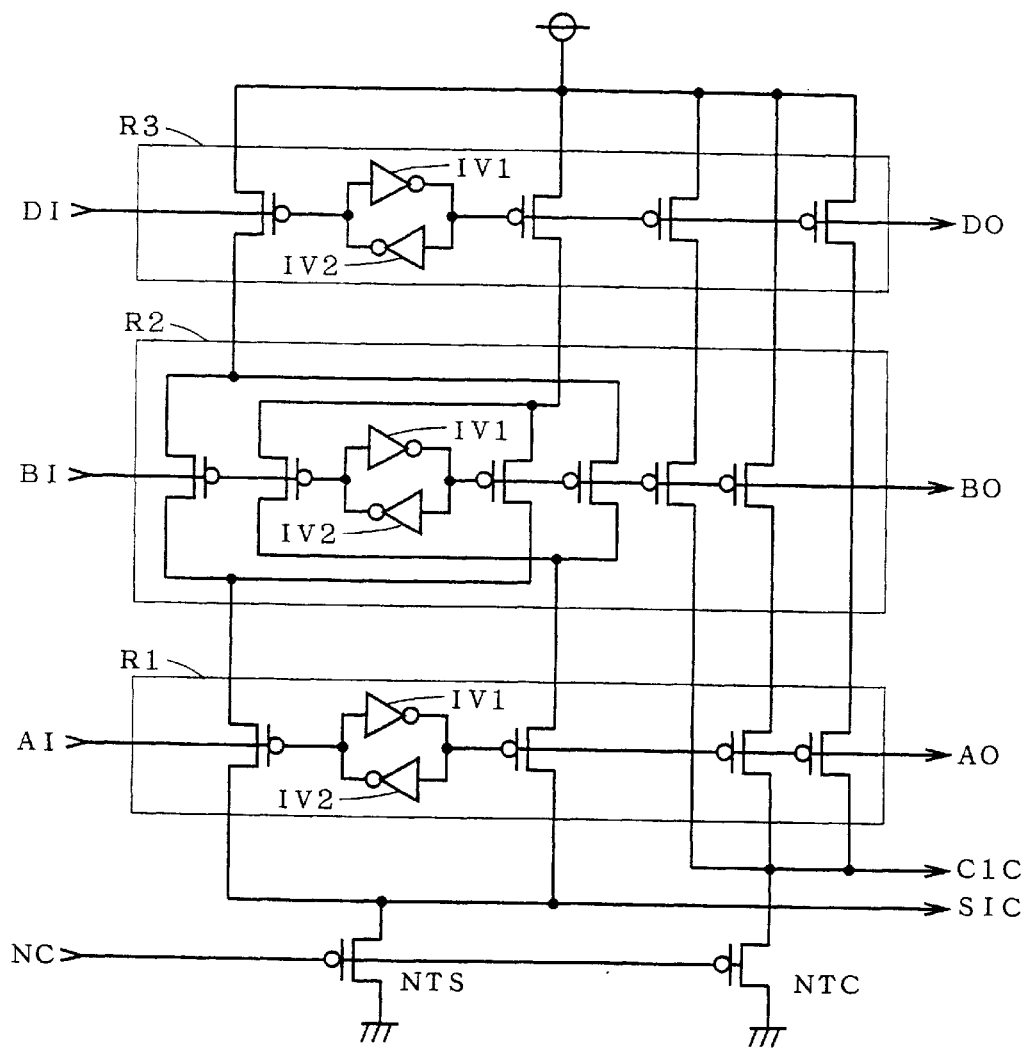
FIG. 10 is a circuit diagram of an operation circuit in accordance with a tenth preferred embodiment of the present invention.

FIG. 10 is a circuit diagram of an operation circuit in accordance with the tenth preferred embodiment of the present invention. The operation circuit of FIG. 10 is a three-input adder circuit for negative logic output. An addition output S1C which is one of the operation results of the three-input addition, a carry output C1C which is one of the operation results of the three-input addition, an NMOS transistor NTS serving as the first output unit, an NMOS transistor NTC serving as the second output unit and the control line NC are shown in FIG. 10. The elements in FIG. 10 other than the above correspond to those with the same reference signs in FIG. 9.

The operation circuit of the tenth preferred embodiment has a constitution which is a logically-inverted one of the operation circuit of the ninth preferred embodiment. Specifically, in the constitution of the operation circuit of the tenth preferred embodiment, the NMOS transistors in the first, second and third store units R1, R2 and R3, the transistors PTS and PTC, the control line PC, the ground and the power supply in the operation circuit of the ninth preferred embodiment are replaced by the PMOS transistors in the first, second and third store units R1, R2 and R3, the transistors NTS and NTC, the control line NC, the power supply and the ground, respectively.

The tenth preferred embodiment produces the same effect as the ninth preferred embodiment.

The Eleventh Preferred Embodiment

Figure 11:
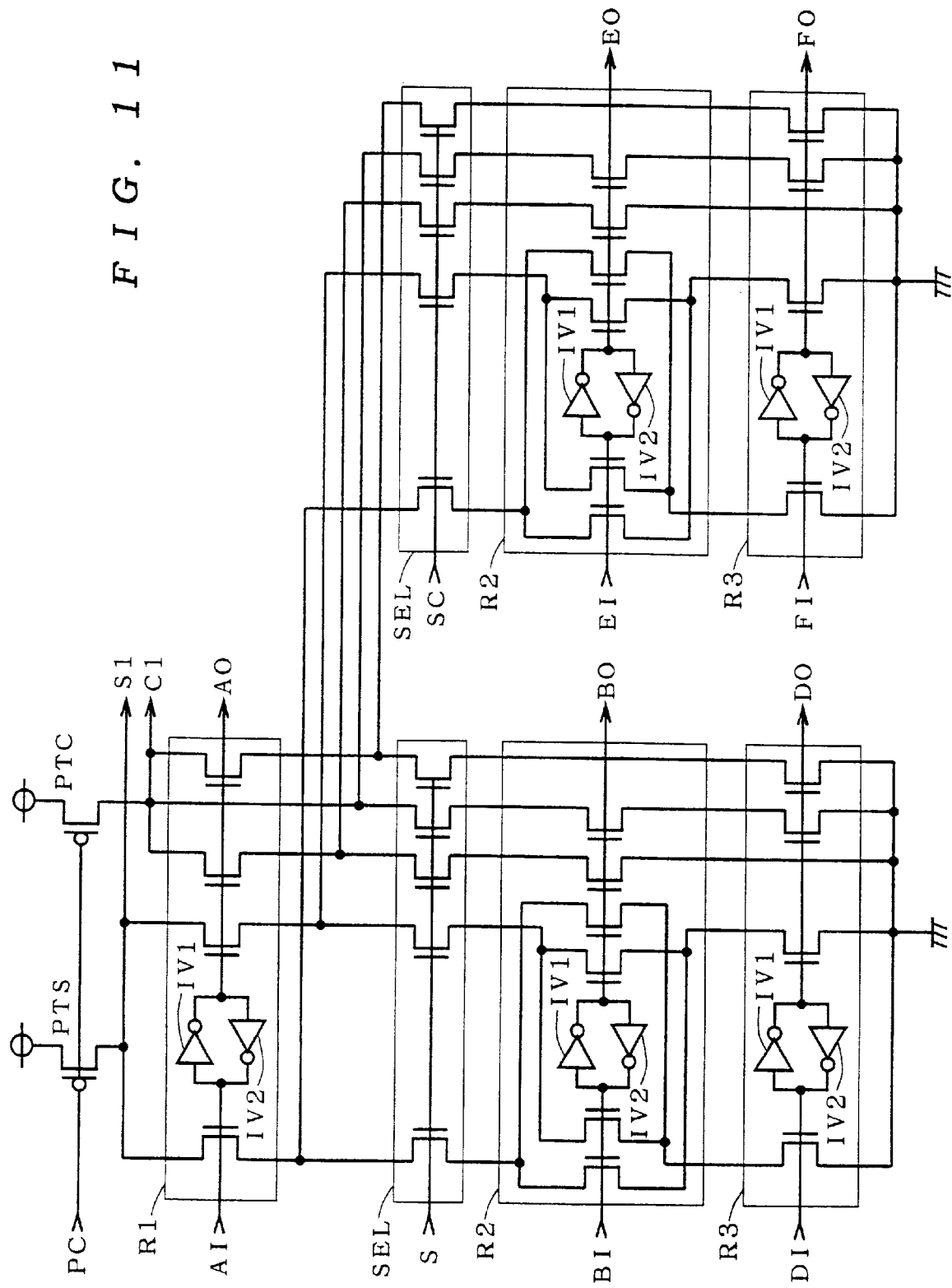
FIG. 11 is a circuit diagram of an operation circuit in accordance with an eleventh preferred embodiment of the present invention.

FIG. 11 is a circuit diagram of an operation circuit in accordance with the eleventh preferred embodiment of the present invention. The operation circuit of FIG. 11 is a three-input adder circuit for positive logic output having the time-division function. The selection units SEL, complementary selection signals S and SC, the second input EI different from the second input BI, the third input FI different from the third input DI are shown in FIG. 11. The elements in FIG. 11 other than the above correspond to those with the same reference signs in FIG. 9.

The operation circuit of the eleventh preferred embodiment includes the second store unit R2 for the second input EI, the third store unit R3 for the third input FI and the selection units SEL in addition to the constitution of the operation circuit of the ninth preferred embodiment. The two selection units SEL are provided between the first store unit R1 and the two second store units R2, respectively.

The operation circuit of the eleventh preferred embodiment primarily performs the same operation as the ninth preferred embodiment and additionally has the time-division function. Specifically, by setting "1" to the selection signal S, the addition output S1 and the carry output C1 of the three-input addition of the first, second and third input AI, BI and DI are outputted to a subsequent circuit (arithmetic operation of data) while the second input EI and third input F1 are loaded into the second store unit R2 for the second input E1 and the third store unit R3 for the third input F1, respectively, and stored therein (loading and storing of data). Next, by setting "1" to the selection signal SC, the addition output S1 and the carry output C1 of the three-input addition of the first, second and third inputs AI, EI and FI are outputted to a subsequent circuit while the second and third inputs BI and DI are loaded into the second and third store units R2 and R3, respectively, and stored therein. Thus, outputting the operation result and loading of data can be concurrently performed.

The eleventh preferred embodiment produces such an effect as follows. The time-division function allows reduction in processing time. When the operation circuit of the eleventh preferred embodiment is applied to each of the processor elements in the systolic array 10 discussed in the background art, the operating speed becomes higher because the loading and storing and the arithmetic operation can be concurrently performed in the repetition of loading, storing and arithmetic operation as discussed in the background art.

The Twelfth Preferred Embodiment

Figure 12:
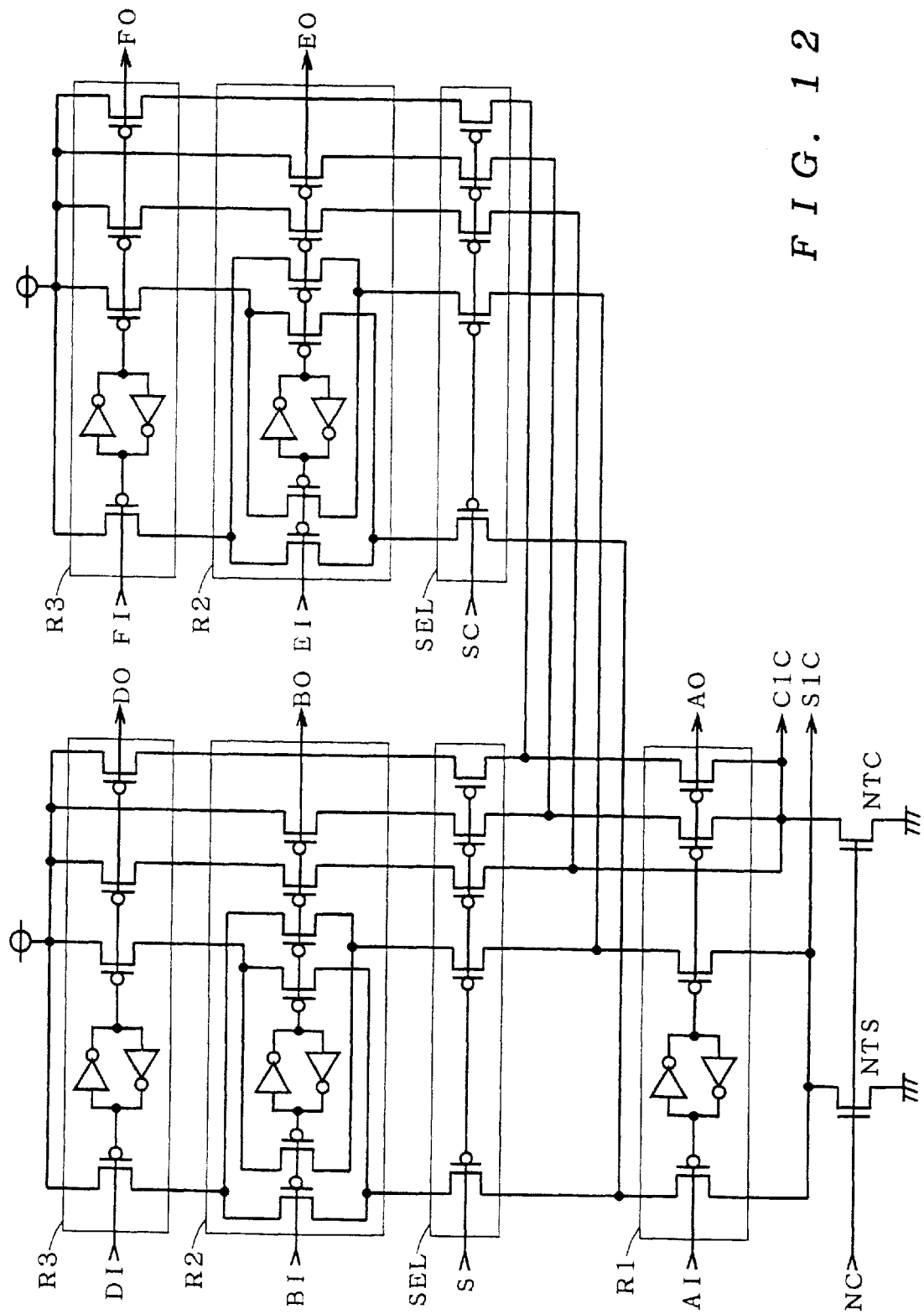
FIG. 12 is a circuit diagram of an operation circuit in accordance with a twelfth preferred embodiment of the present invention.

FIG. 12 is a circuit diagram of an operation circuit in accordance with the twelfth preferred embodiment of the present invention. The operation circuit of FIG. 12 is a three-input adder circuit for negative logic output having the time-division function. The addition output S1C which is one of the operation results of the three-input addition, the carry output C1C which is one of the operation results of the three-input addition, the NMOS transistor NTS serving as the first output unit, the NMOS transistor NTC serving as the second output unit and the control line NC are shown in FIG. 12. The elements in FIG. 12 other than the above correspond to those with the same reference signs in FIG. 11.

The operation circuit of the twelfth preferred embodiment has a constitution which is a logically-inverted one of the operation circuit of the eleventh preferred embodiment. Specifically, in the constitution of the operation circuit of the twelfth preferred embodiment, the NMOS transistors in the first store unit R1, the two second store units R2 and the two third store units R3, the transistors PTS and PTC, the control line PC, the ground and the power supply in the operation circuit of the eleventh preferred embodiment are replaced by the PMOS transistors in the first store unit R1, the two second store units R2 and the two third store units R3, the transistors NTS and NTC, the control line NC, the power supply and the ground, respectively.

The twelfth preferred embodiment produces the same effect as the eleventh preferred embodiment, except that when "0" is set to the selection signal S, the operation result of the three-input addition of the first, second and third input AI, BI and DI is obtained and when "0" is set to the selection signal SC, the operation result of the three-input addition of the first, second and third input AI, EI and FI is obtained.

The Thirteenth Preferred Embodiment

Figure 13:
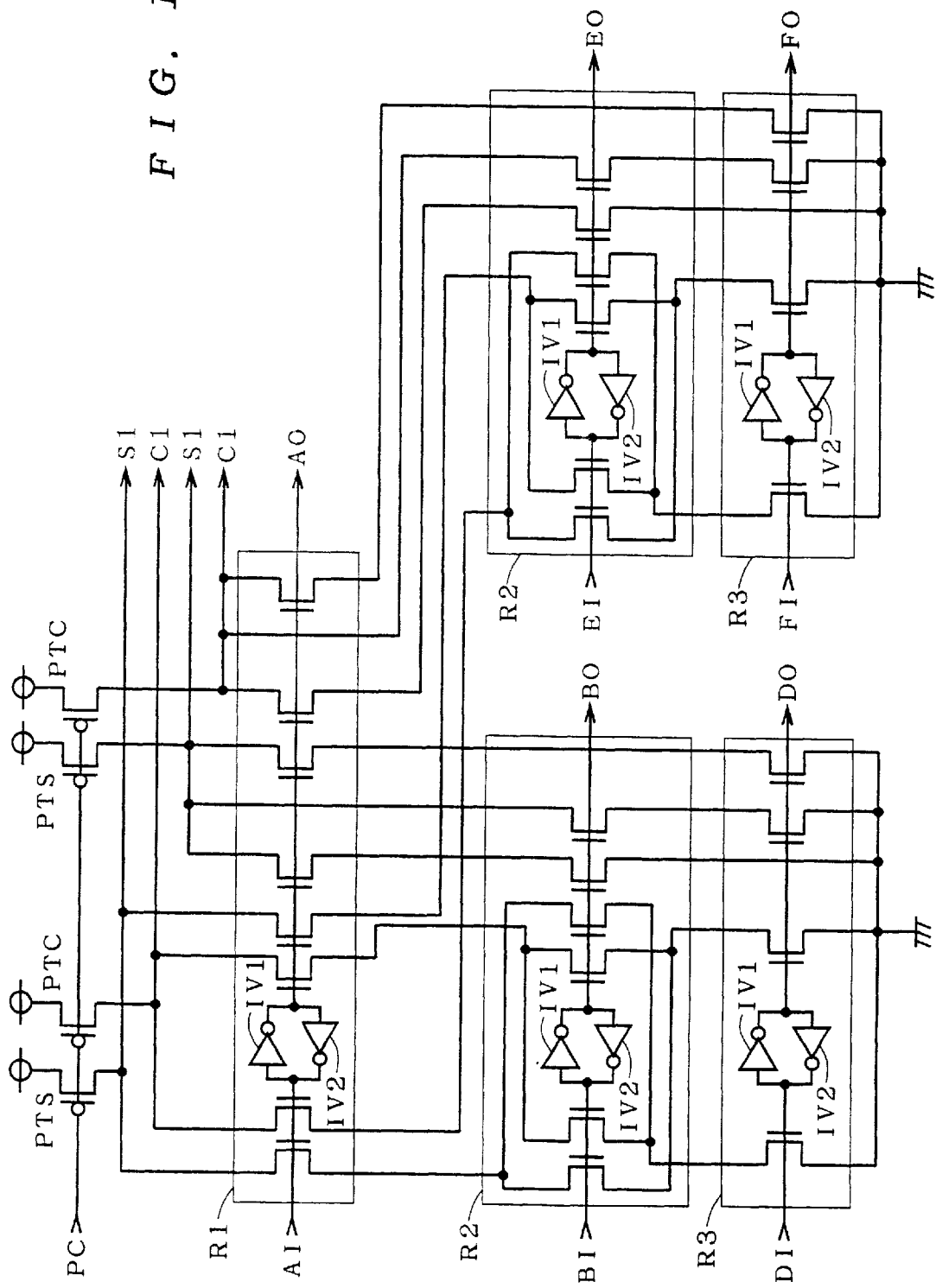
FIG. 13 is a circuit diagram of an operation circuit in accordance with a thirteenth preferred embodiment of the present invention.

FIG. 13 is a circuit diagram of an operation circuit in accordance with the thirteenth preferred embodiment of the present invention. The operation circuit of FIG. 13 is a three-input adder circuit for positive logic output having the parallel-processing function. The second input EI different from the second input BI and the third input FI different from the third input DI are shown in FIG. 13. The elements in FIG. 13 other than the above correspond to those with the same reference signs in FIG. 9.

The operation circuit of the thirteenth preferred embodiment includes the second store unit R2 for the second input EI, the third store unit R3 for the third input FI, another transistors PTS and PTC and the two more NMOS transistors in the first store unit R1 in addition to the constitution of the operation circuit of the ninth preferred embodiment. The first store unit R1 is provided between each combination of the transistors PTS and PTC and each combination of the second and third store units R2 and R3. There are two addition outputs S1 and two carry outputs C1.

The operation circuit of the thirteenth preferred embodiment primarily performs the same operation as the ninth preferred embodiment and additionally has the parallel-processing function. Specifically, the second inputs BI and EI and the third inputs DI and FI are concurrently loaded into the two second store units R2 and the two third store units R3, respectively, and stored therein, and the addition output S1 and the carry output C1 of the three-input addition of the first, second and third inputs AI, BI and DI and the addition output S1 and the carry output C1 of the three-input addition of the first, second and third inputs AI, EI and FI are concurrently outputted.

The thirteenth preferred embodiment produces such an effect as follows. The parallel-processing function allows reduction in processing time. When the operation circuit of the thirteenth preferred embodiment is applied to each of the processor elements in the systolic array 10 discussed in the background art, the operating speed becomes higher because the loading, storing and arithmetic operation can be concurrently performed on two specified areas in the search window data SW.

The Fourteenth Preferred Embodiment

Figure 14:
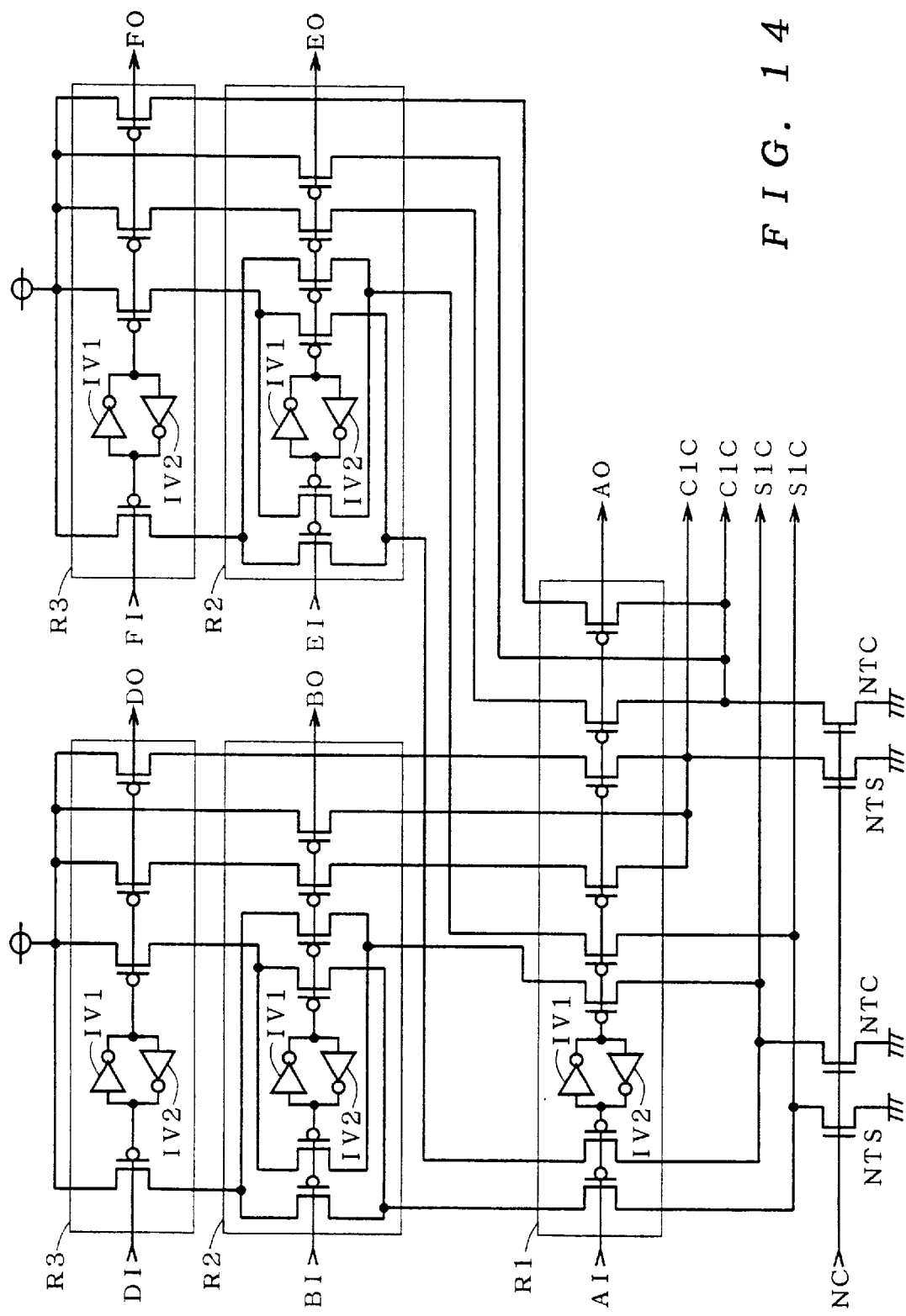
FIG. 14 is a circuit diagram of an operation circuit in accordance with a fourteenth preferred embodiment of the present invention.
Figure 1:
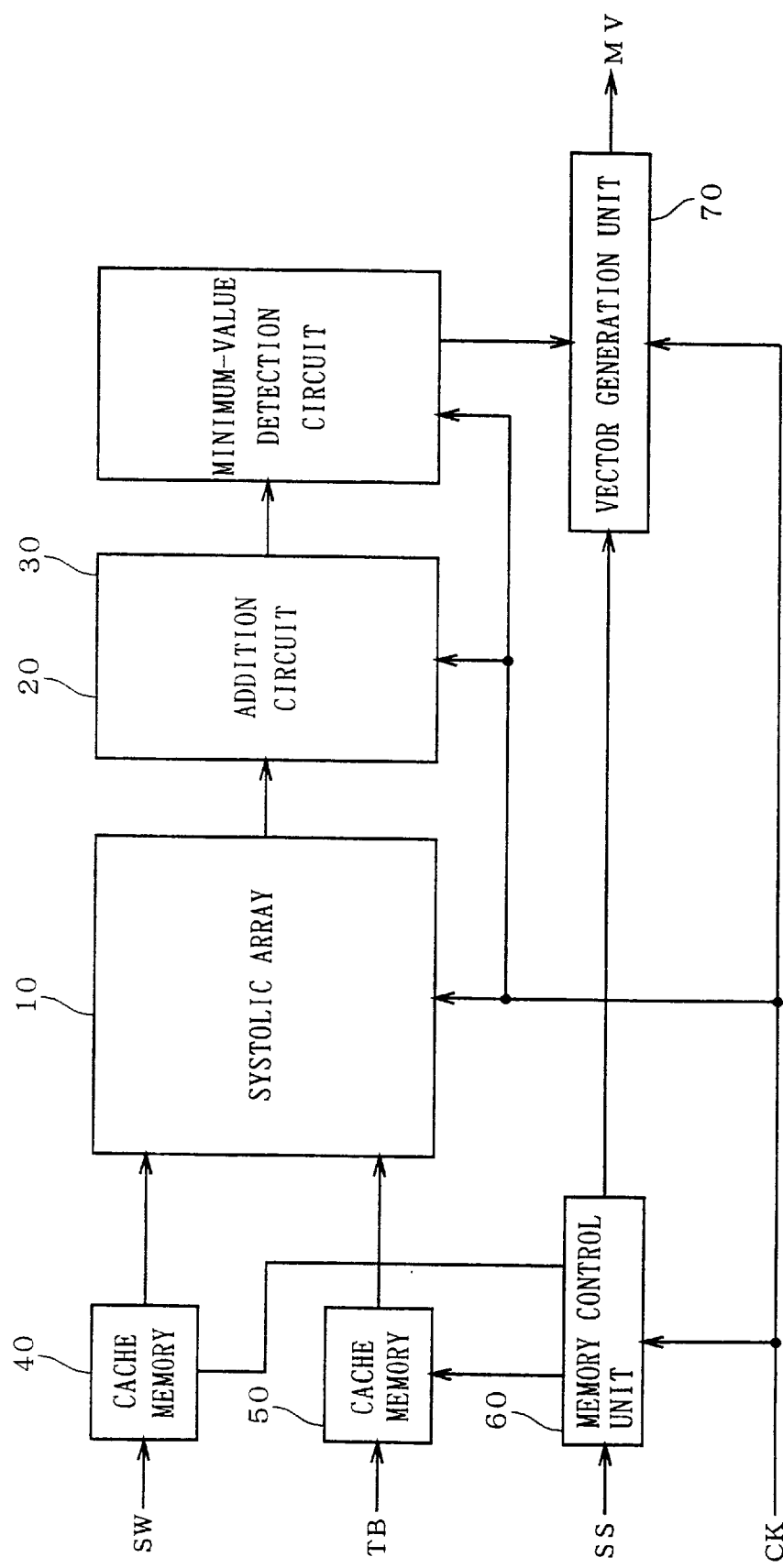
Figure 17:
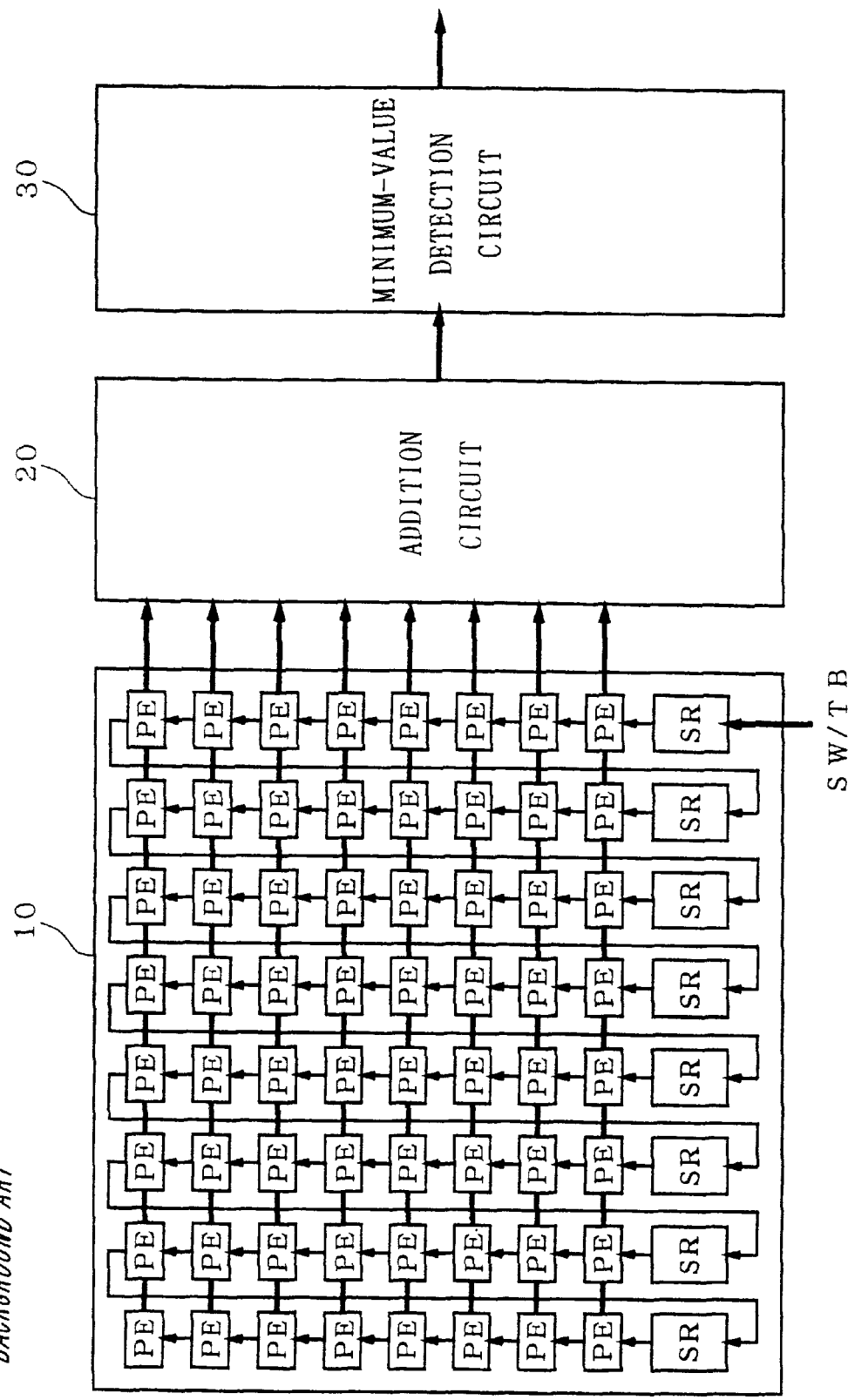
FIG. 17 illustrates a minimum-value detection block in the motion vector detection device.
Figure 18:
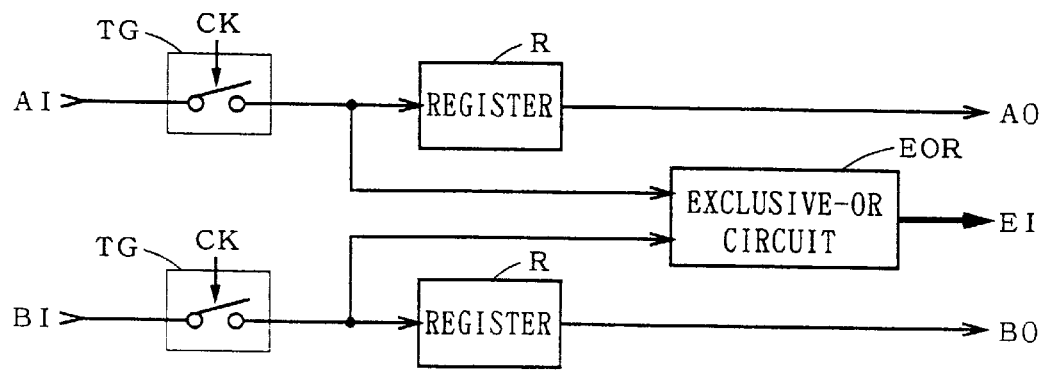
FIGS. 18 to 20 illustrate an absolute-difference operation circuit used in the minimum-value detection block.
Figure 19:
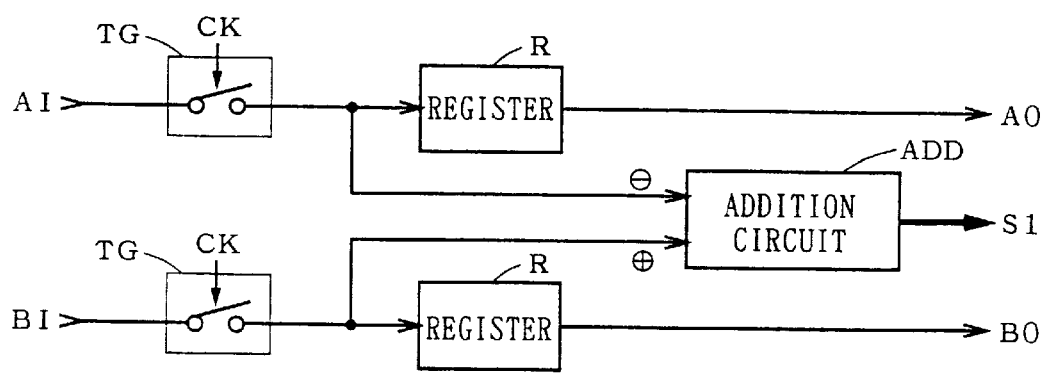
Figure 20:
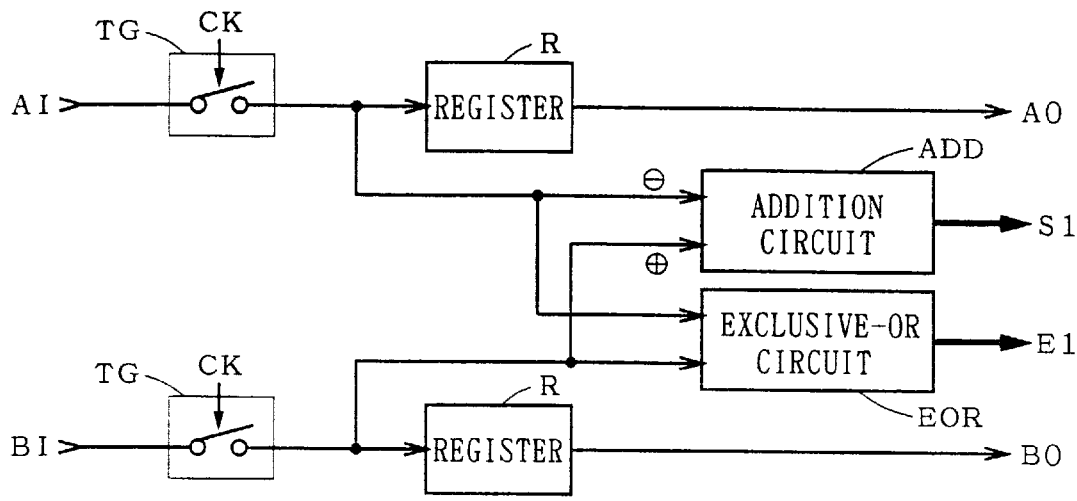

FIG. 14 is a circuit diagram of an operation circuit in accordance with the fourteenth preferred embodiment of the present invention. The operation circuit of FIG. 14 is a three-input adder circuit for negative logic output having the parallel-processing function. The addition output S1C which is one of the operation results of the three-input addition, the carry output C1 which is one of the operation results of the three-input addition, the NMOS transistor NTS serving as the first output unit, the NMOS transistor NTC serving as the second output unit and the control line NC are shown in FIG. 14. The elements in FIG. 14 other than the above correspond to those with the same reference signs in FIG. 13.

The operation circuit of the fourteenth preferred embodiment has a constitution which is a logically-inverted one of the operation circuit of the thirteenth preferred embodiment. Specifically, in the constitution of the operation circuit of the fourteenth preferred embodiment, the NMOS transistors in the first store unit R1, the two second store units R2 and the two third store units R3, the transistors PTS and PTC, the control line PC, the ground and the power supply in the operation circuit of the thirteenth preferred embodiment are replaced by the PMOS transistors in the first store unit R1, the two second store units R2 and the two third store units R3, the transistors NTS and NTC, the control line NC, the power supply and the ground, respectively.

The fourteenth preferred embodiment produces the same effect as the thirteenth preferred embodiment.

Modification

In the operation circuit of the first preferred embodiment, the output of the first inverters IV1 and the output of the second inverter IV2 in the first store unit R1 may be exchanged, and the output of the first inverter IV1 and the output of the second inverter IV2 in the second store unit R2 may be exchanged. To provide an exclusive-OR circuit for negative logic output (EX-NOR) which stores the first and second inputs AI and BI, the output of the first inverter IV1 and the output of the second inverter IV2 in the first store unit R1, which are outputted to the selection unit SEL, may be exchanged, or the output of the first inverter IV1 and the output of the second inverter IV2 in the second store unit R2, which are outputted to the selection unit SEL, may be exchanged.

In the operation circuit of the second preferred embodiment, the transistor PT may be kept in on-state by keeping the potential of the control line PC "L", or the transistor PT may be brought into on-state by making the potential of the control line PC "L" as the need arises. The transistor PT may be replaced by an NMOS transistor, and in this case the potential of the control line PC should be inverted.

In the operation circuit of the third preferred embodiment, the transistor NT may be kept in on-state by keeping the potential of the control line NC "H", or the transistor NT may be brought into on-state by making the potential of the control line NC "H" as the need arises. The transistor NT may be replaced by a PMOS transistor, and in this case the potential of the control line NC should be inverted.

In the operation circuit of the fourth preferred embodiment, the transistor PT may be kept in on-state by keeping the potential of the control line PC "L", or the transistor PT may be brought into on-state by making the potential of the control line PC "L" as the need arises. The transistor PT may be replaced by an NMOS transistor, and in this case the potential of the control line PC should be inverted. Three or more second store units R2 may be provided, and in this case the selection unit SEL should be supplied with a selection signal to select one of three or more second store units R2.

In the operation circuit of the fifth preferred embodiment, the transistor NT may be kept in on-state by keeping the potential of the control line NC "H", or the transistor NT may be brought into on-state by making the potential of the control line NC "H" as the need arises. The transistor NT may be replaced by a PMOS transistor, and in this case the potential of the control line NC should be inverted. Three or more second store units R2 may be provided, and in this case the selection unit SEL should be supplied with a selection signal to select one of three or more second store units R2.

In the operation circuit of the sixth preferred embodiment, the transistor PT may be kept in on-state by keeping the potential of the control line PC "L", or the transistor PT may be brought into on-state by making the potential of the control line PC "L" as the need arises. The transistor PT may be replaced by an NMOS transistor, and in this case the potential of the control line PC should be inverted. Three or more second store units R2 and transistors PT may be provided.

In the operation circuit of the seventh preferred embodiment, the transistor NT may be kept in on-state by keeping the potential of the control line NC "H", or the transistor NT may be brought into on-state by making the potential of the control line NC "H" as the need arises. The transistor NT may be replaced by a PMOS transistor, and in this case the potential of the control line NC should be inverted. Three or more second store units R2 and transistors NT may be provided.

In the operation circuit of the eighth preferred embodiment, the output of the first inverters IV1 and the output of the second inverter IV2 in the first store unit R1 may be exchanged, and the output of the first inverter IV1 and the output of the second inverter IV2 in the second store unit R2 may be exchanged. To provide a three-input adder circuit for negative logic output which stores the first and second inputs AI and BI, the output of the first inverter IV1 and the output of the second inverter IV2 in the first store unit R1, which are outputted to the first selection unit SEL1, may be exchanged, the input and the output of the inverter IV which are outputted to the second selection unit SEL2 may be exchanged and the input and the output of the inverter IV which are outputted to the third selection unit SEL3 may be exchanged, or the output of the first inverter IV1 and the output of the second inverter IV2 in the second store unit R2, which are outputted to the first selection unit SEL1, may be exchanged, the output of the first inverter IV1 and the output of the second inverter IV2 in the third store unit R3, which are outputted to the second selection unit SEL2, may be exchanged, and the output of the first inverter IV2 in the second store unit R2 and the output of the second inverter IV2 in the third store unit R3, which are outputted to the third selection unit SEL3, may be exchanged.

In the operation circuit of the ninth preferred embodiment, the transistors PTS and PTC may be kept in on-state by keeping the potential of the control line PC "L", or the transistors PTS and PTC may be brought into on-state by making the potential of the control line PC "L" as the need arises. The transistors PTS and PTC may be replaced by NMOS transistors, and in this case the potential of the control line PC should be inverted.

In the operation circuit of the tenth preferred embodiment, the transistors NTS and NTC may be kept in on-state by keeping the potential of the control line NC "H", or the transistors NTS and NTC may be brought into on-state by making the potential of the control line NC "H" as the need arises. The transistors NTS and NTC may be replaced by PMOS transistors, and in this case the potential of the control line NC should be inverted.

In the operation circuit of the eleventh preferred embodiment, the transistors PTS and PTC may be kept in on-state by keeping the potential of the control line PC "L", or the transistors PTS and PTC may be brought into on-state by making the potential of the control line PC "L" as the need arises. The transistors PTS and PTC may be replaced by NMOS transistors, and in this case the potential of the control line PC should be inverted. Three or more second store units R2 and third store units R3 may be provided, and in this case the selection unit SEL should be supplied with a selection signal to select one of three or more second store units R2.

In the operation circuit of the twelfth preferred embodiment, the transistors NTS and NTC may be kept in on-state by keeping the potential of the control line NC "H", or the transistors NTS and NTC may be brought into on-state by making the potential of the control line NC "H" as the need arises. The transistors NTS and NTC may be replaced by PMOS transistors, and in this case the potential of the control line NC should be inverted. Three or more second store units R2 and third store units R3 may be provided, and in this case the selection unit SEL should be supplied with a selection signal to select one of three or more second store units R2.

In the operation circuit of the thirteenth preferred embodiment, the transistors PTS and PTC may be kept in on-state by keeping the potential of the control line PC "L", or the transistors PTS and PTC may be brought into on-state by making the potential of the control line PC "L" as the need arises. The transistors PTS and PTC may be replaced by NMOS transistors, and in this case the potential of the control line PC should be inverted. Three or more second store units R2, third store units R3 and transistors PTS and PTC may be provided.

In the operation circuit of the fourteenth preferred embodiment, the transistors NTS and NTC may be kept in on-state by keeping the potential of the control line NC "H", or the transistors NTS and NTC may be brought into on-state by making the potential of the control line NC "H" as the need arises. The transistors NTS and NTC may be replaced by PMOS transistors, and in this case the potential of the control line NC should be inverted. Three or more second store units R2, third store units R3 and transistors NTS and NTC may be provided.

In the operation circuits of the ninth to fourteenth preferred embodiments, elements associated with the carry output may be omitted by omitting the second output unit (the transistor PTC or NTC) and the transistors in the first, second and third store units connected thereto.

While the invention has been shown and described in detail, the foregoing description is in all aspects illustrative and not restrictive. It is therefore understood that numerous modifications and variations can be devised without departing from the scope of the invention.

I claim:

1. An operation circuit for generating inverted values of first to third inputs to perform a three-input addition of said first to third inputs and said inverted values, said operation circuit comprising:
 a first store unit for receiving and storing said first input;
 at least one second store unit for receiving and storing said second input; and
 at least one third store unit for receiving and storing said third input, wherein each of said first store unit, said at least one second store unit and said at least one third store unit has a closed loop consisting of first and second inverters, an output of said first inverter in said first store unit is said inverted value of said first input, an output of said first inverter in said at least one second store unit is said inverted value of said second input, an output of said first inverter in said at least one third store unit is said inverted value of said third input, and wherein said three-input addition is formed based on outputs of first and second inverters of said first store unit, said at least one second store unit and said at least one third store unit.

2. The operation circuit of claim 1 further comprising:

a first selection unit for selecting one of said output of said first inverter and an output of said second inverter in said at least one second store unit in response to an output from said first store unit to output said one which is selected, a second selection unit for selecting one of said output of said first inverter and an output of said second inverter in said at least one third store unit in response to an output from said first selection unit to output said one which is selected as a sum of said three-input addition, and a third selection unit for selecting one of an output from said at least one second store unit and an output from said at least one third store unit in response to said output from said first selection unit to output said one which is selected as a carry digit of said three-input addition.

3. The operation circuit of claim 1 further comprising:

at least one first output unit and at least one second output unit each connected to a first potential, wherein each of said first store unit, said at least one second store unit and said at least one third store unit includes a plurality of transistors each having a control electrode receiving an output from said closed loop, said plurality of transistors in said first store unit, said at least one second store unit and said at least one third store unit constituting a decoder connected between said at least one first output unit and a second potential or between said at least one second output unit and said second potential and receiving said outputs of said first and second inverters in said first store unit, said at least one second store unit and said at least one third store unit, for generating an operation result of said three-input addition of said outputs, and outputs of said at least one first output unit and said at least one second output unit are a sum and a carry digit of said three-input addition, respectively.

4. The operation circuit of claim 3, wherein said at least one second store unit includes a plurality of second store units and said at least one third store unit includes a plurality of third store units, said operation circuit further comprising a selection unit for selecting one of said plurality of second store units and one of said plurality of third store units, wherein said plurality of transistors in said one of said plurality of second store units and said one of said plurality of third store units which are selected by said selection unit are connected between said at least one first output unit and said second potential or between said at least one second output unit and said second potential.

5. The operation circuit of claim 3, wherein said at least one first output unit includes a plurality of first output units and said at least one second output unit includes a plurality of second output units, and said at least one second store unit includes a plurality of second store units and said at least one third store unit includes a plurality of third store units.

6. The operation circuit of claim 1 further comprising:

at least one first output unit connected to a first potential, wherein each of said first store unit, said at least one second store unit and said at least one third store unit includes a plurality of transistors each having a control electrode receiving an output from said closed loop, said plurality of transistors in said first store unit, said at least one second store unit and said at least one third store unit constituting a decoder connected between said at least one first output unit and a second potential and receiving said outputs of said first and second inverters in said first store unit, said at least one second store unit and said at least one third store unit, for generating an operation result of said three-input addition of said outputs, and an output of said at least one first output unit is said three-input addition.

7. The operation circuit of claim 6, wherein said at least one second store unit includes a plurality of second store units and said at least one third store unit includes a plurality of third store units, said operation circuit further comprising a selection unit for selecting one of said plurality of second store units and one of said plurality of third store units, wherein said plurality of transistors in said one of said plurality of second store units and said one of said plurality of third store units which are selected by said selection unit are connected between said at least one first output unit and said second potential.

8. The operation circuit of claim 6, wherein said at least one first output unit includes a plurality of first output units, and said at least one second store unit includes a plurality of second store units and said at least one third store unit includes a plurality of third store units.

* * * * *